United States Patent
Yamazaki et al.

(10) Patent No.: US 7,154,120 B2
(45) Date of Patent: Dec. 26, 2006

(54) LIGHT EMITTING DEVICE AND FABRICATION METHOD THEREOF

(75) Inventors: Shunpei Yamazaki, Tokyo (JP); Takeshi Fukunaga, Kanagawa (JP); Jun Koyama, Kanagawa (JP); Kazutaka Inukai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/756,454

(22) Filed: Jan. 14, 2004

(65) Prior Publication Data

US 2004/0144982 A1 Jul. 29, 2004

Related U.S. Application Data

(62) Division of application No. 09/837,324, filed on Apr. 19, 2001, now Pat. No. 6,706,544.

(30) Foreign Application Priority Data

Apr. 19, 2000 (JP) ............................. 2000-117436

(51) Int. Cl.
*H01L 29/04* (2006.01)
(52) U.S. Cl. ................... 257/72; 257/57; 257/347; 257/350
(58) Field of Classification Search ............ 257/72, 257/57, 347, 350
See application file for complete search history.

(56) References Cited

U.S. PATENT DOCUMENTS

| | | | |
|---|---|---|---|
| 4,963,504 A | 10/1990 | Huang et al. | |
| 5,182,619 A | 1/1993 | Pfiester | |
| 5,543,340 A | 8/1996 | Lee | |
| 5,581,092 A | 12/1996 | Takemura | |
| 5,583,067 A | 12/1996 | Sanchez | |
| 5,643,826 A | 7/1997 | Ohtani et al. | |
| 5,767,930 A | 6/1998 | Kobayashi et al. | |
| 5,841,170 A | 11/1998 | Adan et al. | |
| 5,923,961 A | 7/1999 | Shibuya et al. | |
| 5,923,962 A | 7/1999 | Ohtani et al. | |
| 6,001,714 A | 12/1999 | Nakajima et al. | |
| 6,031,290 A | 2/2000 | Miyazaki et al. | |
| 6,323,070 B1 | 11/2001 | Yamazaki | |
| 6,335,290 B1 | 1/2002 | Ishida | |
| 6,365,917 B1 * | 4/2002 | Yamazaki | 257/72 |

(Continued)

FOREIGN PATENT DOCUMENTS

JP  06-148685  5/1994

(Continued)

OTHER PUBLICATIONS

Baldo et al., "*Highly Efficient Phosphorescent Emission From Organic Electroluminescent Devices*", Nature vol. 395, Sep. 10, 1998, pp. 151-154.

(Continued)

*Primary Examiner*—Long Pham
(74) *Attorney, Agent, or Firm*—Nixon Peabody LLP; Jeffrey L. Costellia

(57) ABSTRACT

The present invention provides an inexpensive light emitting device and an inexpensive electric appliance. By reducing the number of photolithography steps in the fabrication of TFTs, the yield of the light emitting devices can be enhanced and the manufacturing period can be shortened. The present invention is substantially characterized in that a gate electrode is formed of a conductive film made of a plurality of layers and the concentration of impurity regions formed in the inside of an active layer can be adjusted by making use of the selection ratio at the time of etching these layers.

38 Claims, 22 Drawing Sheets

U.S. PATENT DOCUMENTS

| | | |
|---|---|---|
| 6,596,571 B1 | 7/2003 | Arao et al. |
| 2001/0049197 A1 | 12/2001 | Yamazaki et al. |
| 2001/0052950 A1 | 12/2001 | Yamazaki et al. |
| 2001/0055841 A1 | 12/2001 | Yamazaki |
| 2002/0000551 A1 | 1/2002 | Yamazaki et al. |

FOREIGN PATENT DOCUMENTS

| | | |
|---|---|---|
| JP | 07-130652 A | 5/1995 |
| JP | 07-235680 | 9/1995 |
| JP | 08-096959 A | 4/1996 |
| JP | 08-274336 | 10/1996 |
| JP | 09-063770 A | 3/1997 |
| JP | 10-268347 | 10/1998 |
| JP | 11-338786 A | 12/1999 |
| JP | 2002-050765 A | 2/2002 |

OTHER PUBLICATIONS

Baldo et al., "*Very High-Efficiency Green Organic Light-Emitting Devices Based on Electrophosphorescence*", Applied Physics Letters vol. 75, No. 1, Jul. 5, 1999, pp. 4-6.

Tsutsui et al, "*Electroluminescence in Organic Thin Films*", Photochemical Processes in Organized Molecular Systems, 1991, pp. 437-450.

\* cited by examiner

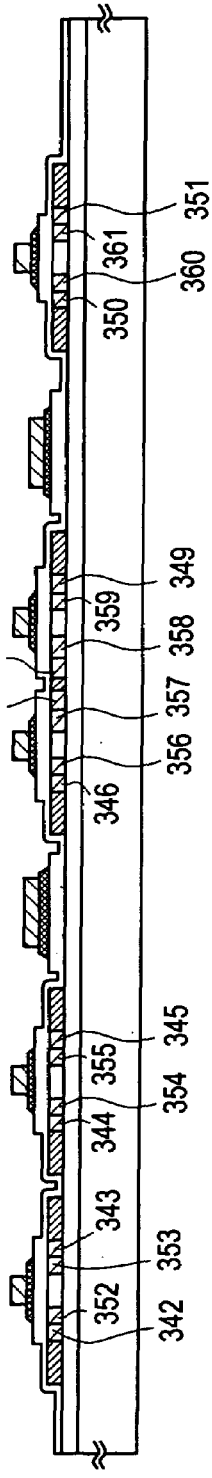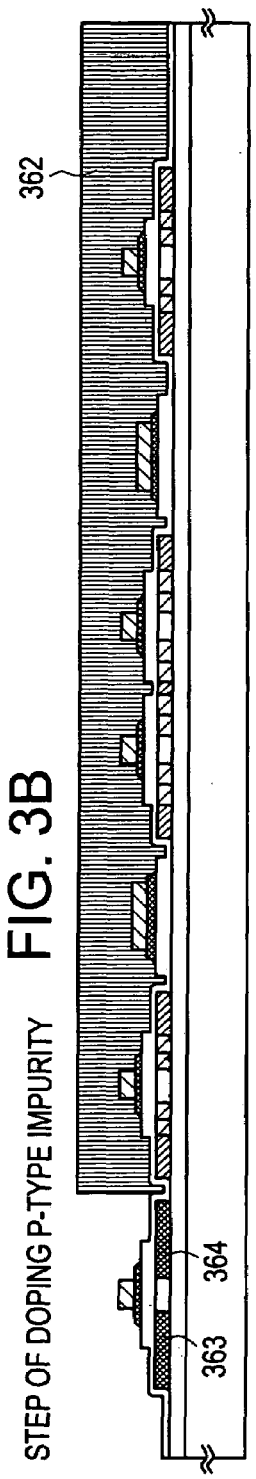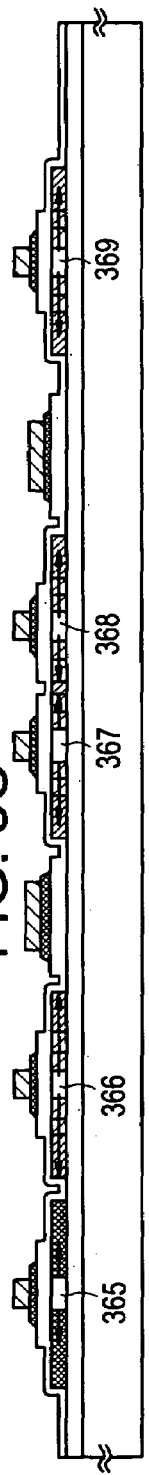

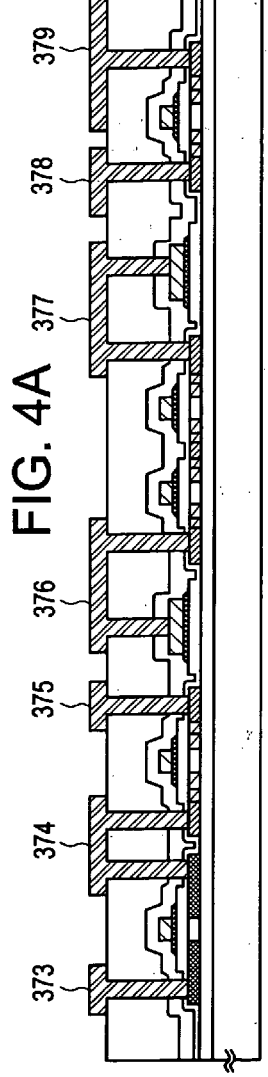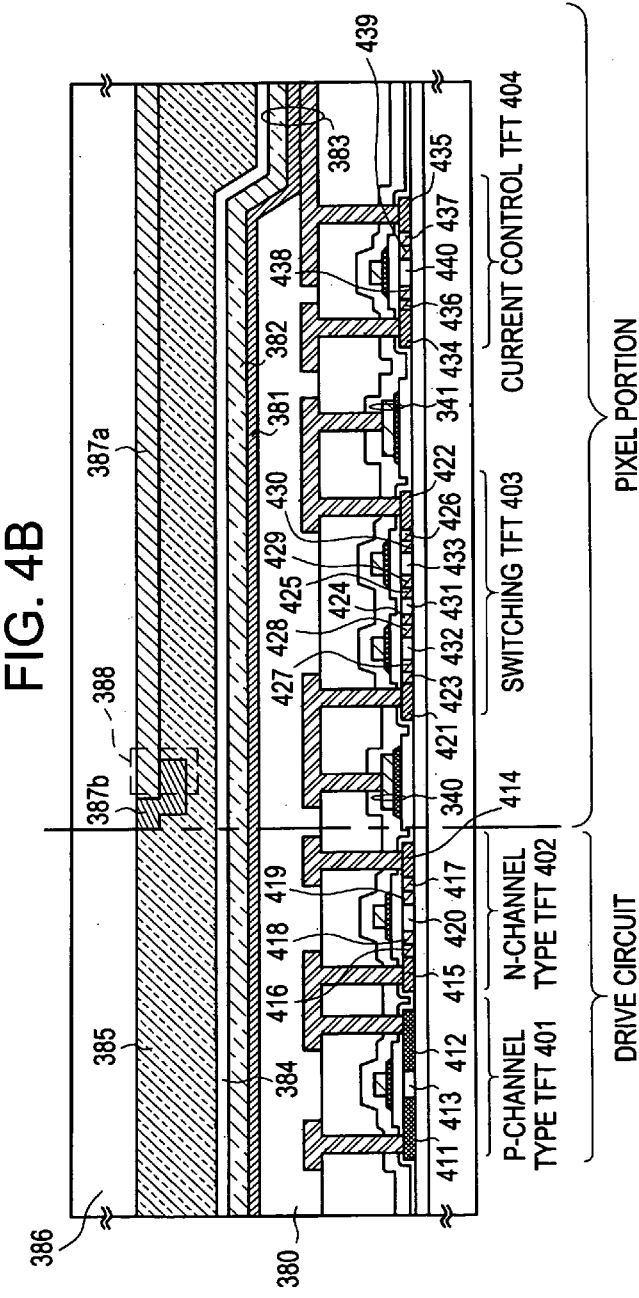

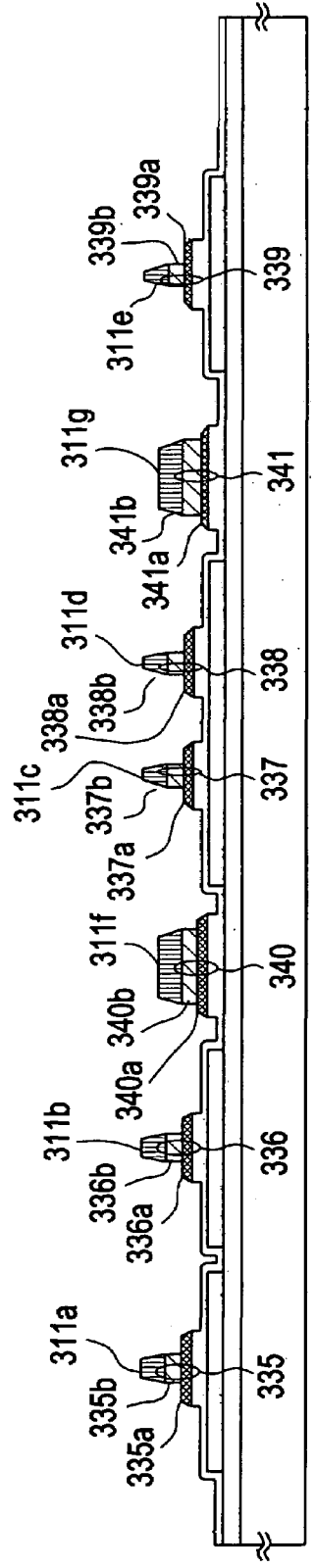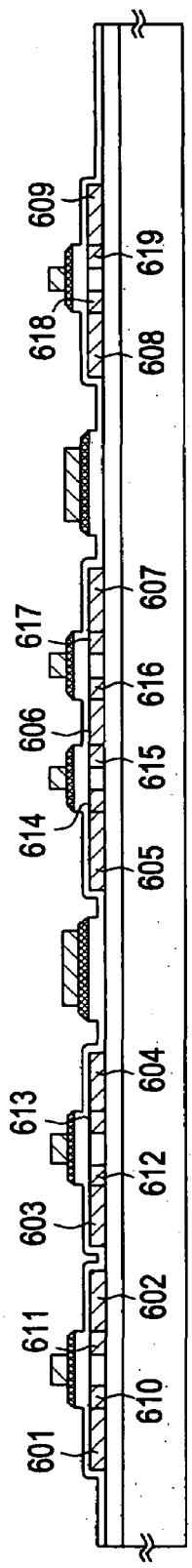

STEP OF DOPING N-TYPE IMPURITY

STEP OF DOPING N-TYPE IMPURITY

STEP OF DOPING N-TYPE IMPURITY

STEP OF DOPING N-TYPE IMPURITY

STEP OF DOPING P-TYPE IMPURITY

LIGHT EMITTING DEVICE AND FABRICATION METHOD THEREOF

BACKGROUND OF THE INVENTION

1. Field of the Invention

The present invention relates to a light emitting device having an element which sandwiches light emitting material between electrodes and an electric appliance which uses such a light emitting device as a display part (display or display monitor), and more particularly to a light emitting device which uses light emitting material which can obtain EL (Electro Luminescence) (called EL material hereinafter). Here, an organic EL display and an organic light emitting diode (OLED: Organic Light Emitting Diode) are included in the light emitting device of the present invention.

Further, the EL material applicable to the present invention includes all EL materials which emit light (phosphorus light and/or fluorescence) through a singlet excitation or a triplet excitation or both excitations.

2. Related Art

Recently, the development of light emitting devices which use self luminous elements (called EL elements hereinafter) making use of an EL phenomenon of EL material (called EL light emitting device hereinafter) has been in progress. Since the EL light emitting device is a display device which uses the self luminous elements, the EL light emitting devices do not require back lights such as liquid crystal displays and have a large angle of visibility. Accordingly, the EL light emitting devices are attracting attentions as a display part of a portable equipment which can be used outside.

There exist two types of EL light emitting devices, that is, a passive matrix type and an active matrix type and both of them have been widely developed. Particularly, recently, the EL light emitting devices of active matrix type have been attracting attentions. The EL light emitting device of active matrix type is characterized in that thin film transistors (called TFT hereinafter) are provided to respective pixels which constitute a pixel portion and an electric current quantity supplied to the EL elements is controlled by the TFT.

An advantage of the active matrix type lies in the image display of high definition which can provide images of a larger information quantity.

However, since respective pixels require the TFTs, the fabrication process becomes complicated compared to that of the passive matrix type so that there arise problems such as the lowering of yield and the increase of fabrication cost due to the prolonged fabrication period. Particularly, when there are many photolithography steps, the lowering of the yield becomes apparent so that the reduction of the photolithography steps has been a crucial task to be solved.

The present invention has been made in view of the above and it is an object of the present invention to provide an inexpensive light emitting device by reducing the fabrication cost which is brought about by the enhancement of the yield and the shortening the fabrication period derived from the reduction of photolithography steps. Further, it is another object of the present invention to provide an inexpensive electric appliance which uses an inexpensive light emitting device as a display part thereof.

SUMMARY OF THE INVENTION

The present invention aims at the enhancement of the yield of the light emitting devices and the shortening of the fabrication period by reducing the photolithography steps related with the fabrication of TFT. The present invention is characterized in that a gate electrode is formed of a plural layers of conductive films and the concentrations of impurity regions formed in the inside of an active layer are adjusted by making use of the selection ratio at the time of etching the conductive films.

An example of fabrication steps of an n-channel type TFT which features the present invention is explained in conjunction with FIG. 1. In FIG. 1(A), numeral 100 indicates an insulation body which may be a substrate provided with an insulation film on a surface thereof, an insulation substrate or an insulation film. A semiconductor film (typically a silicon film) 101 is formed on the insulation body 100 and this semiconductor film 101 constitutes an active layer of TFT. Further, the semiconductor film 101 is covered with an insulation film 102 containing silicon and this insulation film 102 constitutes a gate insulation film of the TFT. Here, as the insulation film which contains silicon, a silicon oxide film, a silicon nitride film, a silicon nitride-oxide film or a laminated film which combines these films can be used.

Subsequently, a conductive film which is made of two or more laminated conductive films is formed on the insulation film 102 containing silicon. Here, the first conductive film 103 and the second conductive film 104 are formed. Here, it is important that the selection ratio can be ensured between the first conductive film 103 and the second conductive film 104 at the time of etching. To be more specific, it is important that there exists a condition which enables the etching of the second conductive film 104 while making the first conductive film 103 remain as it is.

As typical examples, 1) a combination which uses a tantalum nitride film as the first conductive film and a tungsten film as the second conductive film, 2) a combination which uses a tungsten film as the first conductive film and a aluminum alloy film as the second conductive film, or 3) a combination which uses a titanium nitride film as the first conductive film and a tungsten film as the second conductive film are named.

In the combination 1), the tungsten film and the tantalum nitride film are etched by the combination of a chlorine ($Cl_2$) gas and a tetrafluoro carbon ($CF_4$) gas and the etching rate of the tantalum nitride film can be drastically reduced by adding an oxygen ($O_2$) gas to this gas system and hence, the selection ratio can be ensured.

In the combination 2), although the aluminum film is etched by the combination of a bromine trichloride ($BrCl_3$) gas and a chlorine ($Cl_2$) gas, the tungsten film is not etched. Further, although the tungsten film is etched by the combination of a chlorine ($Cl_2$) gas and a tetrafluoro carbon ($CF_4$) gas, the aluminum film is not etched. In this manner, the selection ratio of both films can be ensured.

Subsequently, as shown in FIG. 1(B), the first conductive film 103 and the second conductive film 104 are etched using a resist mask 105 so as to form a gate electrode 106. In this specification, the gate electrode obtained by etching the first conductive film is called a first gate electrode and the gate electrode obtained by etching the second conductive film is called a second gate electrode. Accordingly, the gate electrode 106 is comprised of the first gate electrode 106a and the second gate electrode 106b.

It is preferable that the gate electrode 106 is formed into a shape having a taper depending on the etching condition. Here, the taper is a portion where an end surface at an end portion of the electrode is slanted and an angle made by the end surface and a substrate is called a taper angle. The shape having a taper is a shape where the end portion of the electrode is slanted with a given taper angle and the trapezoid is included in the shape having a taper.

Since the gate insulation film 102 is also etched at the time of forming the gate electrode 106, the film thickness of the gate insulation film 102 is made thin. Although the film thickness may be different depending on the etching condition, it is preferable to suppress the reduction of the film thickness to 20–50 nm.

Then, under this state, the semiconductor film 101 is doped with an impurity element (called an n-type impurity element hereinafter) which forms a semiconductor into an n-type semiconductor. Here, the gate electrode 106 is used as a mask and the n-type impurity element is doped in a self alignment. To be more specific, an element (typically phosphorus or arsenic) which belongs to a group 15 of the periodic table can be used as the n-type impurity element.

Here, as a doping method, a known plasma doping technique or a known ion implantation technique can be used. Further, the concentration of the n-type impurity element doped into the semiconductor film may preferably be $1\times10^{20}$–$1\times10^{21}$ atoms/cm$^3$. Regions 107, 108 which are doped with the n-type impurity element in such a concentration are called n-type impurity regions (a) in this specification.

Subsequently, as shown in FIG. 1(C), the gate electrode 106 is further etched under the same condition at the time of forming the gate electrode 106. Accordingly, side surfaces of the gate electrode 106 are further etched so that a gate electrode 109 with a narrowed line width (reduced contour) is formed (the gate electrode 109 being made of a first gate electrode 109a and a second gate electrode 109b). Further, at this point of time, the reduction of the film thickness of the gate insulation film 102 is in progress.

Then, during the etching of FIG. 1(C), the etching condition is changed to a condition in which a portion of the gate electrode 109, to be more specific, the second gate electrode 109 is selectively etched. Such a condition may be obtained by changing an etching gas, a substrate bias voltage, an electric power supplied to electrodes or the like. Here, since it is sufficient if the selection ratio between the first gate electrode 109a and the second gate electrode 109b can be ensured, the etching condition can be most easily changed by changing the etching gas.

Through these steps, as shown in FIG. 1(D), a gate electrode 111 having a laminar structure consisting of the first gate electrode 109a and the second gate electrode 110 can be formed.

Then, a doping step of an n-type impurity element is again performed under this state. In this doping step, an acceleration voltage is increased than the doping step of FIG. 1(B) so as to make the impurity element reach a deep position.

Here, the n-type impurity element is doped into regions indicated by numerals 112, 113 at the concentration of $1\times10^{17}$–$1\times10^{19}$ atoms/cm$^3$. Regions 112, 113 which are doped with the n-type impurity element in such a concentration are called n-type impurity regions (b) in this specification.

In this doping step, a portion where the conductive films are laminated in two or more layers, that is, a lamination portion made of the first gate electrode 109a and the second gate electrode 110 becomes a mask and the n-type impurity element is doped such that the n-type impurity element penetrates a portion of the gate electrode that is, a portion where only the first gate electrode 109a is exposed.

In this manner, regions indicated by numerals 114, 115 allow the doping of the n-type impurity element penetrating the end portion of the first gate electrode 109a (portion which is not brought into contact with the second gate electrode 110) and hence, the n-type impurity element is doped at the concentration (preferably $1\times10^{16}$–$1\times10^{18}$ atoms/cm$^3$) lower than that of the n-type impurity region (b). Regions 114, 115 which are doped with the n-type impurity element in such a concentration are called n-type impurity regions (c) in this specification.

Here, a region 116 which is not doped with the n-type impurity element is a region which functions as a channel forming region of the TFT and is formed right below the gate electrode 110.

Thereafter, as shown in FIG. 1(E), by forming a passivation film 117, an interlayer insulation film 118, and a source wiring 119 and a drain wiring 120 which are brought into contact with the semiconductor film which constitutes an active layer of the TFT, an n-channel type TFT is completed. As the passivation film 117, a silicon nitride film or a silicon nitride-oxide film may be used. Further, as the interlayer insulation film 118, an inorganic insulation film, an organic insulation film or a lamination film made of these films may be used. As the organic insulation film, a resin film made of polyimide, acrylic resin, polyamide or BCB (benzocyclobutene) can be used. Further, as the source wiring 119 and the drain wiring 120, known conductive films may be used.

In the above-mentioned fabrication steps, the photolithography steps are made of four steps which are respectively performed at the time of forming the semiconductor film 101, at the time of forming the gate electrode 106, at the time of forming contact holes of the interlayer insulation film and at the time of forming the source wiring and the drain wiring. To form a CMOS circuit, since a p-channel type TFT must be prepared, one more photolithography step becomes necessary. However, even such a case, the number of photolithography steps can be restricted to five times.

In the TFT shown in FIG. 1(E), an n-type impurities region (b) 113 and an n-type impurities region (c) 115 are formed between the channel forming region 116 and the drain region 108. Here, the n-type impurities region (c) 115 is superposed on the first gate electrode 109a while sandwiching the gate insulation film 102 therebetween and this structure is effective in preventing the hot carrier deterioration. Further, the n-type impurities region (b) 113 is a region which performs the similar operation as that of a conventional LDD (Light Dope Drain) region.

Accordingly, in the TFT shown in FIG. 1(E), the measure to cope with the hot carrier is provided by the n-type impurities region (c) and the measure to cope with the leak current is provided by the n-type impurities region (b) thus providing a highly reliable structure. In this manner, the TFT having such high reliability can be fabricated through the five photolithography steps and hence, the yield of the whole light emitting device including the light emitting elements can be enhanced and the fabrication period can be shortened. Still further, it becomes possible to fabricate the light emitting device at a low cost with high reliability.

The present invention is not limited to the above-mentioned constitution and the constitutions of embodiments which are explained hereinafter and various modification are conceivable without departing from the technical concept of the present invention.

BRIEF EXPLANATION OF THE DRAWINGS

FIGS. 3(A) to 3(D) are views showing a fabrication step of a pixel portion and a drive circuit.

FIGS. 4(A) and 4(B) are views showing a fabrication step of a pixel portion and a drive circuit.

FIGS. 13(A) to 13(D) are views showing a fabrication step of the pixel portion and the drive circuit.

DESCRIPTION OF THE PREFERRED EMBODIMENT

Preferred embodiments of the present invention are explained in detail hereinafter in conjunction with attached drawings.

Embodiment 1

This embodiment of the present invention is explained in conjunction with FIG. 2 to FIG. 4. Here, the explanation is made with respect to a method which simultaneously fabricates a pixel portion and a TFT which constitutes a drive circuit disposed around the pixel portion. For a brevity purpose, however, with respect to the drive circuit, a CMOS circuit which constitutes a basic unit is illustrated.

Figure 1A:
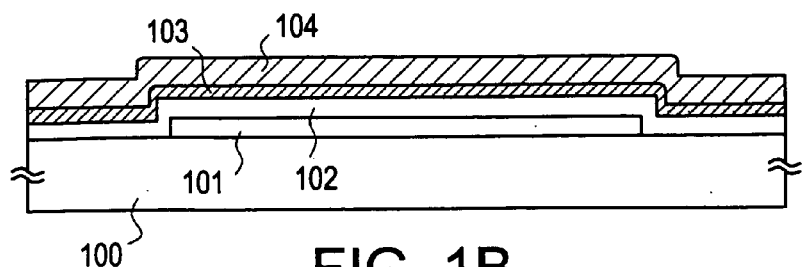
FIGS. 1(A) to 1(E) are views showing fabrication steps of an n-channel type TFT of the present invention.
Figure 1B:
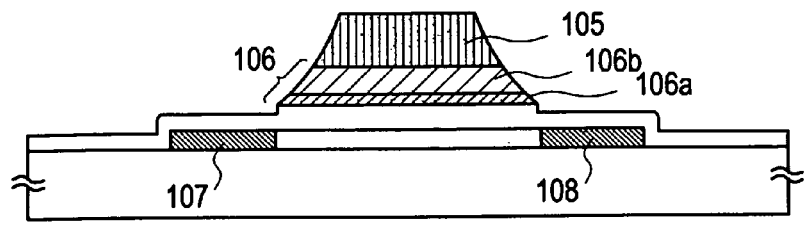
Figure 1C:
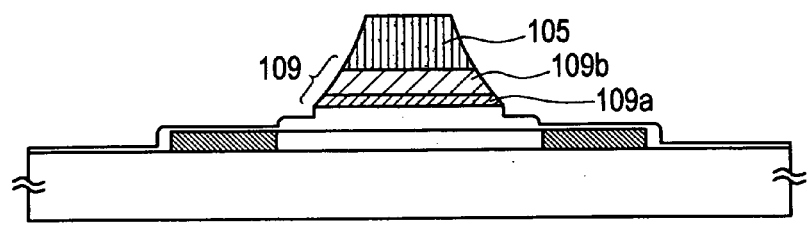
Figure 1D:
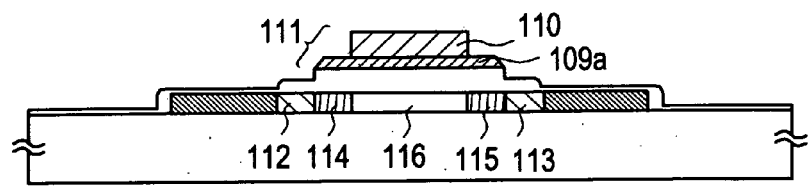
Figure 1E:
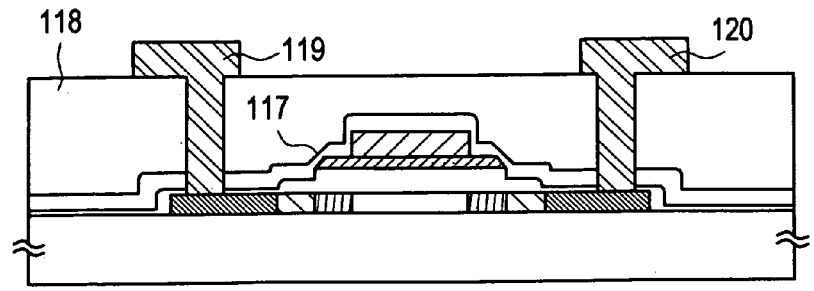
Figure 2A:
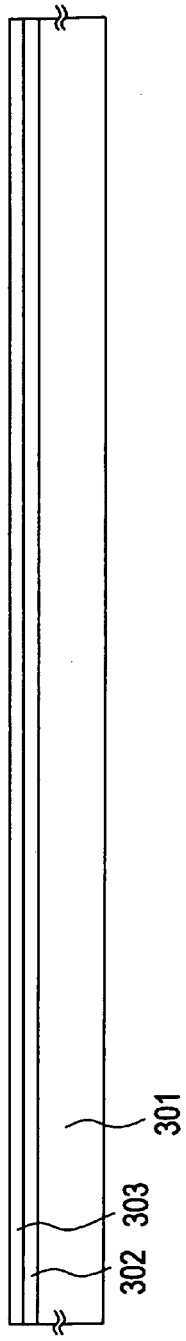
FIGS. 2(A) to 2(E) are views showing a fabrication step of a pixel portion and a drive circuit.

First of all, as shown in FIG. 2(A), a background film 302 having a thickness of 300 nm is formed on a glass substrate 301. In this embodiment, a silicon nitride-oxide film is laminated as the background film 302. Here, it is preferable to set the nitrogen concentration of a portion of the background film 302 which is brought into contact with the glass substrate 301 at 10–25 wt %.

Further, it is effective to make the background film 302 have a heat radiation effect and hence, it is preferable to provide a carbon film, particularly DLC (diamond-like carbon) film to either both surfaces or one surface of the substrate 301. The DLC film can be formed by either a CVD method or a sputtering method. The DLC film is advantageous in view of the fact that the film can be formed within a temperature range from a room temperature to not more than 100° C.

Subsequently, an amorphous silicon film (not shown in the drawing) having a thickness of 50 nm is formed on the background film 302 in a known method. Here, it is unnecessary to limit such a film to the amorphous silicon film and it is enough so long as the film is a semiconductor film including an amorphous structure (including microcrystalline semiconductor film). Further, a compound semiconductor film including an amorphous structure such as an amorphous silicon germanium film or the like may be used. The film thickness of the film may preferably be 20–100 nm.

Then, using a technique described in Japanese Patent Laid-open No. 130652/1995, the amorphous silicon film is crystallized to form a crystalline silicone film (also called polycrystalline silicon film or polysilicon film) 303. In this embodiment, nickel is used as an element which promotes the crystallization. It is needless to say that a laser anneal crystallization method which uses laser beams and a lamp anneal crystallization method which uses infrared light are used as other crystallization methods.

Figure 2B:
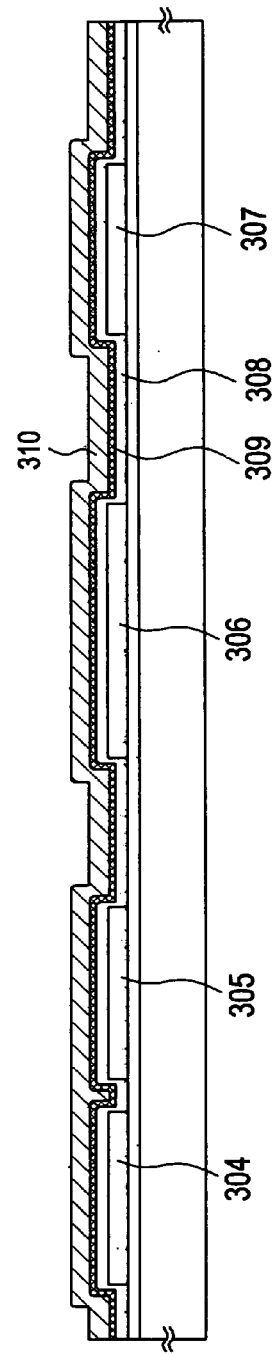

Subsequently, as shown in FIG. 2(B), the crystalline silicone film 303 is etched by a first photolithography step to form island-like semiconductor films 304–307. These constitute the semiconductor films which will later become active layers of TFTs.

Here, in this embodiment, a protective film (not shown in the drawing) made of a silicon oxide film and having a thickness of 130 nm is formed on the semiconductor films 304–307 and then the semiconductor films 304–307 are doped with an impurity element which form a semiconductor into a p-type semiconductor (called p-type impurity element hereinafter). As the p-type impurity element, an element which belongs to a group 13 of the periodic table (typically boron or gallium) can be used. This protective film is provided for preventing the crystalline silicon film from directly being exposed to plasma at the time of doping the impurity and for enabling the delicate concentration control.

Further, the concentration of the p-type impurity element doped into the semiconductor films 304–307 may preferably be $1\times10^{15}$–$5\times10^{17}$ atoms/cm$^3$ (typically $1\times10^{16}$–$1\times10^{17}$ atoms/cm$^3$). The p-type impurity element added at such a concentration is used for the adjustment of a threshold voltage of the n-channel type TFT.

Subsequently, a gate insulation film 308 is formed such that the film 308 covers the semiconductor films 304–307. As the gate insulation film 308, an insulation film having a thickness of 10–200 nm, preferably 50–150 nm and containing silicon may be used. This film 308 may adopt either a single-layer structure or a laminated structure. In this embodiment, a silicon nitride-oxide film having a thickness of 115 nm is used.

Then, a tantalum nitride film having a thickness of 30 nm is formed as a first conductive film 309. Further, a tungsten film having a thickness of 370 nm is formed as a second conductive film 310. These metal films may be formed by a sputtering method. Further, by adding an inert gas such as Xe, Ne or the like as a sputtering gas, it becomes possible to prevent the film peeling-off derived from a stress. Further, by setting the purity of a tungsten target to 99.9999%, the tungsten film having a low resistance with a resistivity of 20 mΩcm or less can be formed.

Subsequently, resist masks 311a–311g are formed and the first conductive film 309 and the second conductive film 310 are etched. In this specification, the etching treatment performed at this stage of operation is called a first etching treatment.

This embodiment adopts an etching method which uses ICP (Inductively Coupled Plasma). As an etching gas, a mixture gas of a tetrafluoro carbon ($CF_4$) gas and a chlorine ($Cl_2$) gas is used and the film forming pressure is set to 1 Pa. Under this state, an RF power (13.56 MHz) of 500 W is applied to a coil-type electrode to generate plasma. Further, an RF power (13.56 MHz) of 150 W is applied as a self-bias voltage to a stage on which the substrate is mounted so as to apply a negative self bias voltage to the substrate.

By performing the etching treatment under such conditions, the selection ratio of the tantalum nitride film and the tungsten film becomes close to 1:1 and hence, they can be etched unitarily. Further, it maybe possible to form them in a tapered shape having a taper angle of 15–45° by making use of the retardation of the resist masks 311a–311e. Under the etching conditions of this embodiment, a taper angle of approximately 25° can be obtained.

In this manner, gate electrodes 312–316 and a source wiring 317 and a drain wiring 318 of the switching TFT which are respectively made of a laminated film constituted of a first conductive film and a second conductive film are formed. The drain wiring 318 also works as a gate electrode of a current control TFT.

Then, the semiconductor films 304–307 are doped with an n-type impurity element (phosphor in this embodiment) in a self-aligning manner using the gate electrodes 312–316, the source wiring 317 and the drain wiring 318 as masks. Impurity regions 319–327 formed in this manner include the n-type impurity element at the concentration of $1\times10^{20}$–$1\times10^{21}$ atoms/$cm^3$(typically $2\times10^{20}$–$5\times10^{21}$ atoms/$cm^3$). These impurity regions 319–327 form a source region and a drain region of the n-channel type TFT.

Subsequently, the etching of the gate electrodes is performed by directly using the resist masks 311a–311g. The etching conditions at this time may be equal to the etching condition of the first etching treatment. Here, the tapered portions of the gate electrodes are retracted to form gate electrodes 328–332, a source wiring 333 and a drain wiring 334 which have a line width narrower (smaller contour) than the line width shown in FIG. 2(C).

Figure 2C:
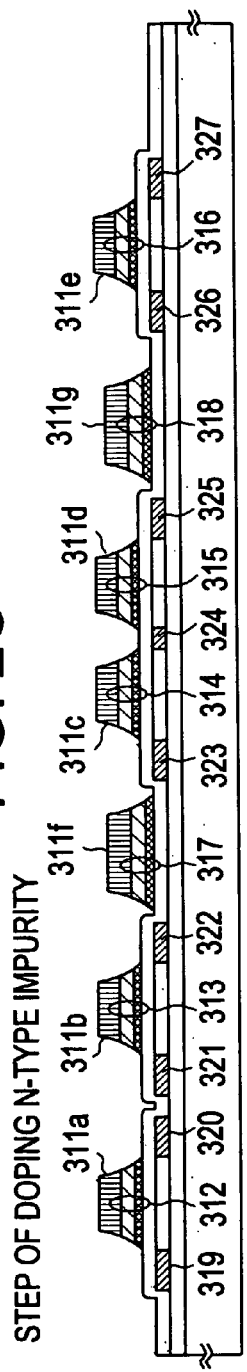
Figure 2D:
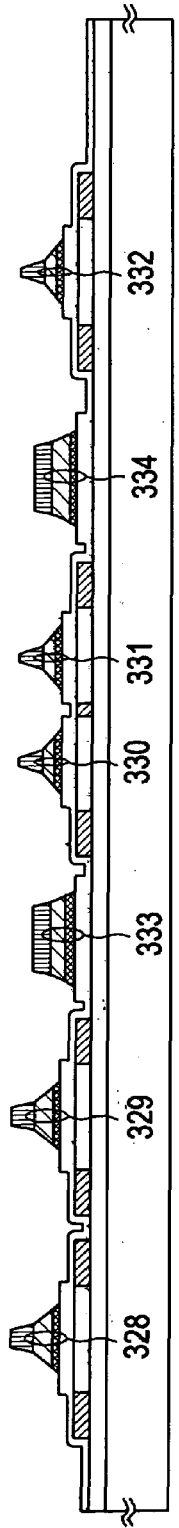
Figure 2E:
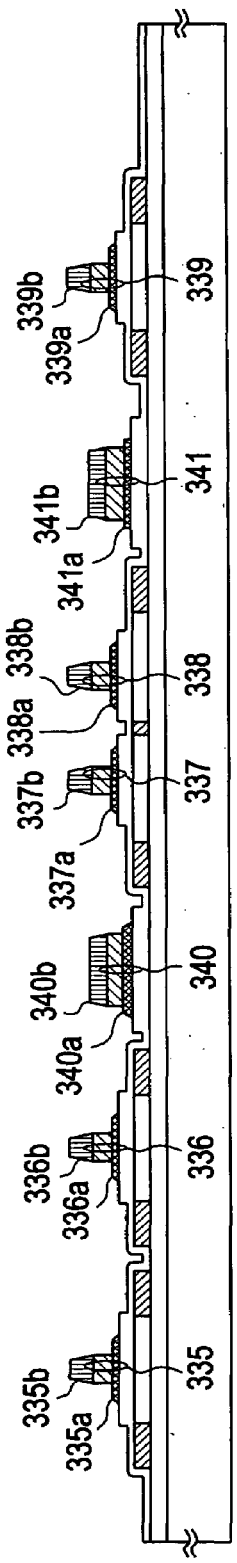

Further, as shown in FIG. 2(E), the second conductive film (tungsten film) is selectively etched by directly using the resist masks 311a–311g. Here, the etching conditions may mix an oxygen gas as the etching gas compared to the first etching treatment. In this specification, the etching treatment performed here is called a second etching treatment. Here, by using the oxygen as an etching gas in addition, the progress of the etching of the first conductive film (tantalum nitride film) can be made extremely slow.

Here, gate electrodes 335–339 which have a laminated structure made of the first gate electrodes 335a–339a and the second gate electrodes 335b–339b can be formed. Further, a source wiring 340 which has a laminated structure made of a first source wiring 340a and a second source wiring 340b and a drain wiring 341 which has a laminated structure made of a first drain wiring 341a and a second drain wiring 341b can be formed.

Subsequently, the resist masks 311a–311g are removed. Then, as shown in FIG. 3(A), the semiconductor films 304–307 are doped with an n-type impurity element (phosphor in this embodiment). In this step, the adjustment is performed such that the n-type impurity element is doped into n-type impurity regions 342–351 at the concentration of $2\times10^{16}$–$5\times10^{19}$ atoms/$cm^3$(typically $5\times10^{17}$–$5\times10^{18}$ atoms/$cm^3$). In this specification, the impurity regions which are doped with the n-type impurity element at this concentration are called n-type impurity regions (b).

Further, n-type impurity regions 352–361 are also formed simultaneously. Since these impurity regions are formed by the n-type impurity element which penetrates the first gate electrodes 335a–339a, phosphorus is doped to the n-type impurity regions 352–361 at the concentration of ½–1/10 (typically ⅓–¼) of the n-type impurity regions 342–351. To be more specific, the n-type impurity regions 342–351 includes the n-type impurity element at the concentration of $1\times10^{16}$–$5\times10^{18}$ atoms/$cm^3$(typically $3\times10^{17}$–$3\times10^{18}$ atoms/$cm^3$). In this specification, the impurity regions which are doped with the n-type impurity element at this concentration are called n-type impurity regions (c).

Further, since it is necessary to dope the n-type impurity element by making the n-type impurity element penetrate the first gate electrodes 335a–339a and the gate insulation film 308, the acceleration voltage is set to a relatively high value such as 70–120 kV (90 kV in this embodiment).

Subsequently, as shown in FIG. 3(B), a resist mask 362 is formed. Then, a p-type impurity element (boron in this embodiment) is doped to form impurity regions 363, 364 which contain boron at high concentration. Here, boron is doped by an ion doping method which uses diborane ($B_2H_6$) such that the concentration of the boron becomes $3\times10^{20}$–$3\times10^{21}$ atoms/$cm^3$(typically $5\times10^{20}$–$1\times10^{21}$ atoms/$cm^3$). The acceleration voltage may be 20–30 kV. In this specification, the impurity regions which are doped with the p-type impurity element at this concentration are called p-type impurity regions (a).

Here, although the p-type impurity regions (a) 363, 364 include region which are already doped with phosphorus at the concentration of $1\times10^{20}$–$1\times10^{21}$ atoms/$cm^3$, the boron doped at this stage of operation is doped at the concentration at least three times greater than the concentration of phosphorus. Accordingly, the preformed n-type impurity regions are completely inverted to the p-type and function as the p-type impurity regions.

Subsequently, after removing the resist mask 362, a protective film (not shown in the drawing) made of a silicon nitride film or a silicon nitride-oxide film is formed. Then, the n-type impurity element or the p-type impurity element which are doped at respective concentration is activated. As activation means, a furnace annealing method is used. In this embodiment, a heat treatment is performed in an electric heating furnace at a temperature of 550° C. for four hours in the nitrogen atmosphere. Here, it is preferable to restrict the oxygen concentration in the nitrogen atmosphere as low as possible to prevent the oxidization of the gate electrodes. The oxygen concentration may preferably be set to not more than 1 ppm.

Here, in the regions doped with the n-type impurity element, that is, in the n-type impurity regions and the p-type impurity regions including the n-type impurity element, nickel used for crystallization of the amorphous silicon film moves in an arrow direction to perform gettering. That is, the nickel concentration in the channel forming regions 365–369 of the TFT is largely reduced and becomes at least not more than $1\times10^{16}$ atoms/$cm^3$ (however, this value being the lower limit of measurement of mass secondary ion spectrometry).

Further, as shown in FIG. 3(D), a protective film 370 made of silicon nitride film or a silicon nitride-oxide film is formed. Thereafter, a heat treatment is performed at a temperature range of 300–450° C. in the nitrogen atmosphere so as to perform the hydrogenation treatment. This step is a step in which unpaired bonding hands (dangling bonds) of the semiconductor are subject to hydrogen termination by hydrogen which is thermally excited. In this treatment, hydrogen contained in the protective film 370 is diffused so as to perform the hydrogenation treatment. As other method, a known plasma hydrogenation treatment may be performed.

Further, it may be possible to perform a heat treatment at a temperature of 300–450° C. for 1–12 hours in the atmosphere containing hydrogen of 3–100% to perform the hydrogenation treatment.

After completion of the hydrogenation treatment, a resin film having a thickness of 1–2 μm is formed as an interlayer insulation film 371. As resin material, polyimide, polyamide, acrylic resin or BCB (benzocyclobutene) may be used. Further, photosensitive resin may be also used.

Subsequently, as shown in FIG. 4(A), contact holes are formed in the interlayer insulation film 371 and wirings 373–378 and a pixel electrode 379 are formed. In this embodiment, each wiring is made of a laminated film having a three layer structure which is constituted by continuously forming a titanium film of 50 nm, an aluminum film of 200 nm containing titanium and an aluminum film of 200 nm containing lithium from the lower layer side by sputtering method.

Here, it is important to form a topmost surface of the pixel electrode 379 into a metal surface which has the small work function. This is because that the pixel electrode 379 directly functions as a cathode of an EL element. Accordingly, it is preferable that at least the topmost surface of the pixel electrode 379 is made of a metal film containing an element which belongs to a group 1 or a group 2 of the periodic table or a bismuth (Bi) film. Further, since the wirings 373–378 are formed simultaneous with the pixel electrode 379, they are formed of the same conductive film.

Here, the wirings 373, 375 function as source wirings of a CMOS circuit and the wiring 374 functions as a drain wiring. Further, the wiring 376 functions as a wiring which electrically connects the source wiring 340 and a source region of a switching TFT while the wiring 377 functions as a wiring which electrically connects the drain wiring 341 and a drain region of the switching TFT. Further, the wiring 378 is a source wiring (corresponding to a power supply line) of a current control TFT and numeral 379 indicates the pixel electrode of the current control TFT.

Subsequently, as shown in FIG. 4(B), a bank 380 is formed. The bank 380 may be formed by patterning an insulation film or an organic resin film of 100–400 nm containing silicon. This bank 380 is formed such that the bank 380 fills in a gap defined between pixels (between pixel electrodes). Further, the bank 380 is provided also for the purpose of preventing organic EL material such as a light emitting layer which will be formed next from directly coming into contact with an end portion of the pixel electrode 379. In other words, the bank 380 may be called an insulation film having opening portions on a flat surface of the pixel electrode 379.

Since the bank 380 is an insulation film, it is necessary to pay attention to the electrostatic breakdown of the element at the time of forming the film. In this embodiment, the resistivity is decreased by doping carbon particles and pigment in the insulation film which constitutes the bank 380 so as to suppress the generation of static electricity. Here, a doping quantity of the carbon particles and pigment may be adjusted so as to make the resistivity to $1\times10^6$–$1\times10^{12}$ Ωm (preferably $1\times10^8$–$1\times10^{10}$ Ωm).

Here, a pretreatment is performed on the surface of the pixel electrode 379. In this embodiment, the whole substrate is heated at a temperature of 100–120° C. and the plasma treatment is performed using argon, neon or helium. Due to this step, oxygen and water adhered to the surface of the pixel electrode 379 are removed and simultaneously a natural oxide film which is formed on the surface of the electrode is also removed.

Subsequently, an EL layer 381 is formed. In this embodiment, a laminated body made of a hole injection layer and a light emitting layer is called the EL layer. That is, a laminated body which is constituted by combining the hole injection layer, a hole transport layer, a hole interruption layer, an electron transport layer, an electron injection layer or an electron interruption layer with the light emitting layer is defined as the EL layer. Here, the EL layer 381 may be made of either organic material or inorganic material and further may be made of either high molecular material or low molecular material.

In this embodiment, as the electron injection layer, a film having a thickness of 5–10 nm is formed of lithium fluoride and, as the light emitting layer which emits white light, a polyvinyl carbazole (PVK) film having a thickness of 80 nm is formed. Lithium acetyl acetate is formed by a vapor deposition and polyvinyl carbazole is coated by dissolving it in 1, 2-dichloro-methane. Further, the light emitting layer is subjected to the heat treatment within a temperature range (typically 80–120° C.) which does not collapse the EL layer after being coated and hence, a solvent is evaporated to produce a thin film.

For example, the light emitting layer which is obtained by dissolving PVK, Bu-PBD (2-(4'-tert-butylphenyl)-5-(4"-biphenyl)-1,3,4-(oxadiazole), cumarin 6, DCM1 (4-dicyanomethylene-2-methyl-6-p-dimethylamino styryl -4H-pyran), TPB (tetraphenyl butadiene) and Nile red in the 1,2-dichloro-methane may be used.

Further, as high-molecular material which can be used as the light emitting layer which emits white light, besides the above-mentioned material, materials described in Japanese Patent Laid-open No. 96959/1996 or Japanese Patent Laid-open No. 63770/1997 can be used.

Further, a copper phthalocyanine (CuPc) film having a thickness of 20 nm is formed on the light emitting layer as the hole injection layer. Polythiophene (PEDOT) may be used in place of copper phthalocyanine.

After forming the EL layer 381 in this manner, an anode 382 made of an oxide conductive film which has a large work function and is transparent to a visible light is formed with a thickness of 300 nm. In this embodiment, an oxide conductive film formed by doping gallium oxide into zinc oxide is used. Besides such an oxide conductive layer, an oxide conductive film made of indium oxide, zinc oxide, tin oxide or a compound of these materials can be used. In this manner, the EL element 383 which includes the pixel electrode (cathode) 379, the EL layer 381 and the anode 382 is formed.

It is effective to form a passivation film 384 such that the passivation film 384 covers the EL element 383 after forming the anode 382. The passivation film 384 may be made of an insulation film including a carbon film, a silicon nitride film or a silicon nitride-oxide film and is used in a form that the insulation film is used in a single layer or in a combined laminated layer.

Here, it is preferable to use a film exhibiting a favorable coverage as the passivation film and it is effective to use a carbon film, particularly a DLC (diamond-like carbon) film.

The DLC film can be formed within a temperature range from a room temperature to less than 100° C. and hence, the DLC film can be easily formed above the EL layer 381 having low heat resistance. Further, the DLC film exhibits a high blocking effect against oxygen and hence, the oxidation of the EL layer 381 can be prevented. Accordingly, it becomes possible to overcome a problem that the EL layer 381 is oxidized during a period in which an ensuing sealing step is performed.

Further, a sealing member 385 is formed on the passivation film 384 and a cover member 386 is laminated over the passivation film 384. As the sealing material 385, ultraviolet curing resin may preferably be used and it is effective to provide material having a moisture absorption effect or material having an oxidation prevention effect in the inside of the sealing material 385. Further, as the cover member 386, a glass substrate, a metal substrate, a ceramic substrate or a plastic substrate (including plastic film) can be used. It is effective to preliminarily provide a carbon film, particularly a DLC film on both surfaces or one surface of the cover member 386. When the plastic film is used as the cover member, the DLC film may be formed on both sides of the cover member 386 using a roll-to-roll method.

Further, coloring layers 387a, 387b are formed on the cover member 386. The coloring layer 387a is a coloring layer which allows wavelengths having the peak in the vicinity of 650 nm to pass therethrough (hereinafter called "red coloring layer") and the coloring layer 387b is a coloring layer which allows wavelengths having the peak in the vicinity of 450 nm to pass therethrough (hereinafter called "blue coloring layer").

It is preferable to use a coloring layer of the EL light emitting device which exhibits the low pigment content to ensure a large quantity of light. Further, a quantity of light can be increased by making the film thickness of the coloring layer thin. Still further, it is unnecessary for the coloring layer to have a sharp peak wavelength as in the case of a coloring layer used in a liquid crystal display device. It is rather preferable to use a coloring layer having broad peak wavelengths.

Further, by making the coloring layers 387a, 387b contain 1–10% of black pigment, the external light entering from the outside of the EL light emitting device can be absorbed so that a drawback that a viewer is reflected on a cathode (pixel electrode 379) can be suppressed.

Further, in this embodiment, the coloring layers 387a, 387b are formed such that they are superposed on the source wiring 340. Since a quantity of light which passes a superposed portion 388 is drastically decreased, superposed portion 388 functions as a light shielding portion. With the provision of the light shielding portion 388 over the source wiring 340, it becomes possible to prevent the color mixing between neighboring pixels.

In this manner, the EL light emitting device having the structure shown in FIG. 4(B) is completed. It is effective to continuously perform the processing up to the step for forming the passivation film 384 after forming the bank 380 using a film forming device of a multi-chamber system (or an in-line system) without releasing the processing in the atmosphere. However, when the EL layer is formed by a spin coating method, it is preferable to perform the processing in the nitrogen atmosphere or the rare gas atmosphere which is subjected to the deoxidizing treatment. Further, by developing the above concept, it may be possible to continuously perform the processing up to the step for laminating the covering material 386 without releasing the processing in the atmosphere.

Here, each TFT is explained. A drive circuit is formed by using a CMOS circuit which complementarily combines a p-channel type TFT 401 and an n-channel type TFT 402 as a basic unit. Here, the drive circuit includes a shift register, a buffer, a level shifter, a latch, a sampling circuit (including a transfer gate) or a D/A converter or the like.

The active layer of the p-channel type TFT 401 includes a source region 411, a drain region 412 and a channel forming region 413. Here, the source region 411 and the drain region 412 are superposed on the first gate electrode 335a while sandwiching the gate insulation film 308 between the source region 411 and the drain region 412 and the first gate electrode 335a.

Further, the active layer of the n-channel type TFT 402 includes a source region 414, a drain region 415, n-type impurity regions (b) 416, 417, n-type impurity regions (c) 418, 419 and a channel forming region 420. Here, n-type impurity regions (b) 416, 417 are formed such that they are not superposed on the first gate electrode 336a in a form that they sandwich the gate insulation film 308 together with the first gate electrode 336a. On the other hand, the n-type impurity regions (c) 418, 419 are formed such that they are superposed on the first gate electrode 336a while sandwiching the gate insulation film 308 together with the first gate electrode 336a. Here, the n-type impurity regions (c) 418, 419 which are formed such that they are superposed on the first gate electrode 336a have an effect that the injection of hot carrier can be suppressed and hence, the deterioration phenomenon derived from the injection of hot carrier can be effectively suppressed.

Further, a switching TFT 403 and a current control TFT 404 are formed in the pixel portion. The drain of the switching TFT 403 is electrically connected to the gate of the current control TFT 404 and the switching operation of the current control TFT 404 is controlled through the switching TFT 403. Then, a current quantity which flows into the EL element is controlled by the current control TFT 404.

An active layer of the switching TFT 403 includes a source region 421, a drain region 422, n-type impurity regions (b) 423–426, n-type impurity regions (c) 427–430, a separation region 431, channel forming regions 432, 433. Further, the source region 421 is connected to the source wiring 340 through the wiring 379. Still further, the drain region 422 is connected to the drain wiring 341 through the wiring 380. This drain wiring 341 is connected to the gate electrode 339 of the current control TFT 404.

The structure of the switching TFT 403 is substantially equal to that of the n-channel type TFT 402. Here, the n-type impurity regions (b) 423–426 are formed such that they are not superposed on the first gate electrode 337a, 338a in a form that they sandwich the gate insulation film 308 together with the first gate electrodes 337a, 338a. On the other hand, the n-type impurity regions (c) 427–430 are formed such that they are superposed on the first gate electrodes 337a, 338a while sandwiching the gate insulation film 308 together with the first gate electrodes 337a, 338a. That is, the switching TFT 403 has the structure which can strongly resist the hot carrier deterioration.

Although an example which uses the n-channel type TFT as the switching TFT 403 is exemplified in this embodiment, a p-channel type TFT may be used.

Further, the active layer of the current control TFT 404 includes a source region 434, a drain region 435, n-type impurity regions (b) 436, 437, n-type impurity regions (c) 438, 439 and a channel forming region 440. The structure of the current control TFT 404 is substantially equal to that of the n-channel type TFT 402 and the explanation thereof may be referred to the explanation of the n-channel type TFT 402. Although an example which uses the n-channel type TFT as the current control TFT 404 is exemplified in this embodiment, a p-channel type TFT may be used.

Figure 5:
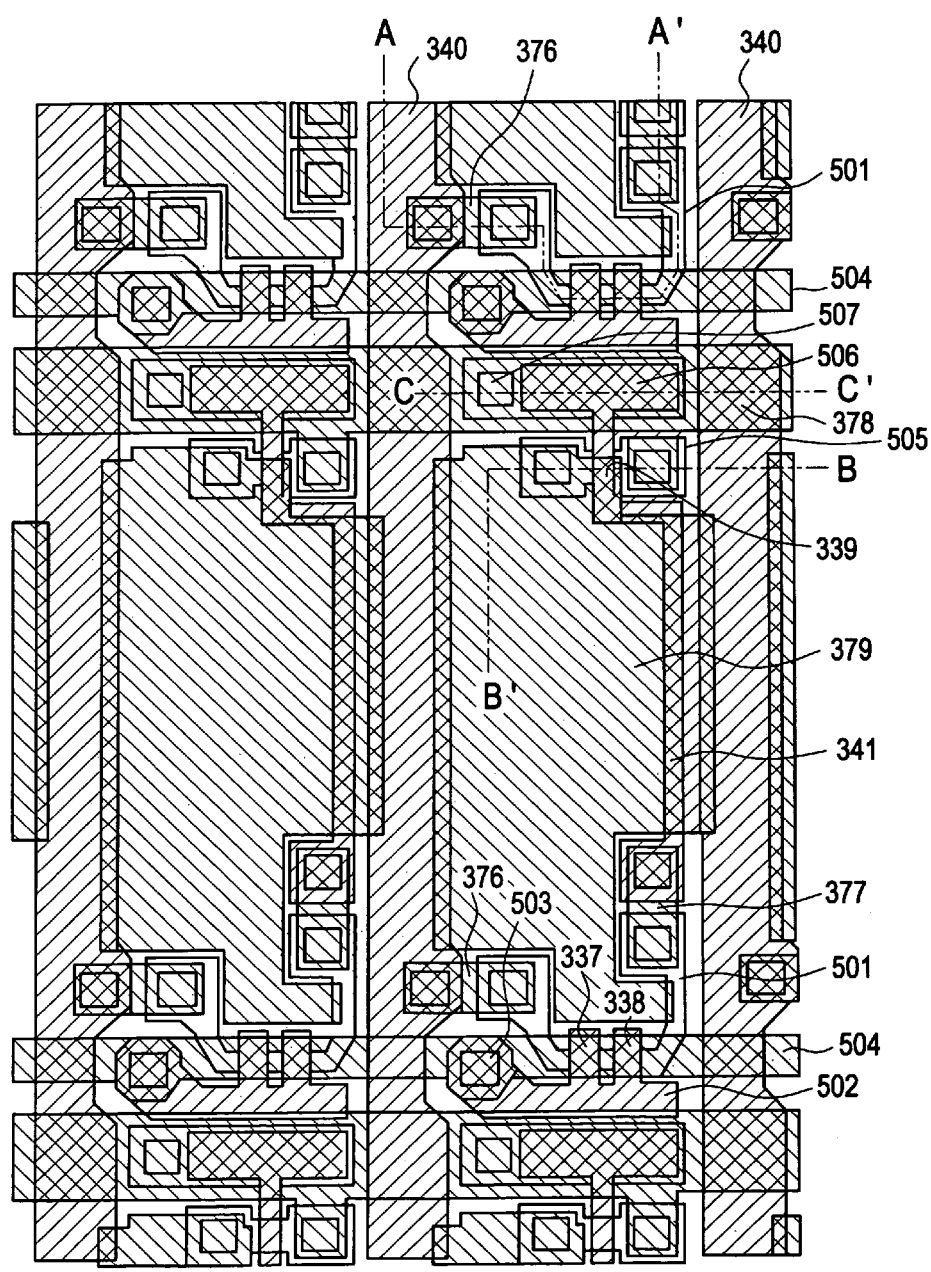
FIG. 5 is a view showing an upper surface structure of the pixel portion.
Figure 6A:
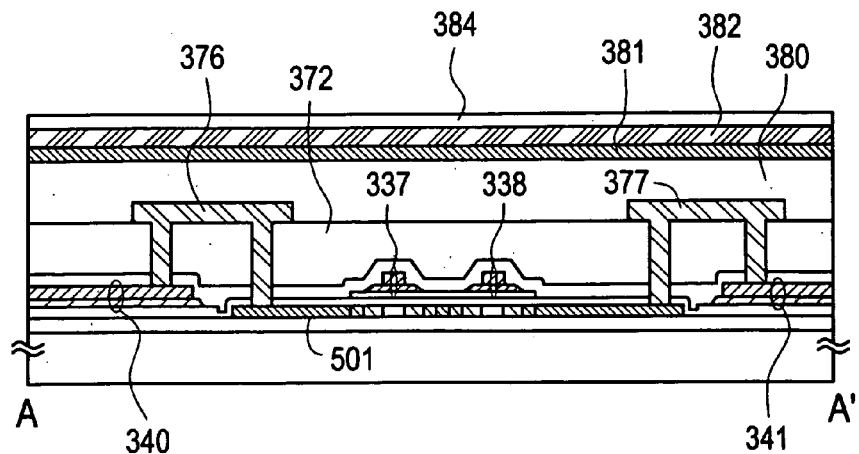
FIGS. 6(A) to 6(C) are views showing a cross-sectional structure of the pixel portion.
Figure 6B:
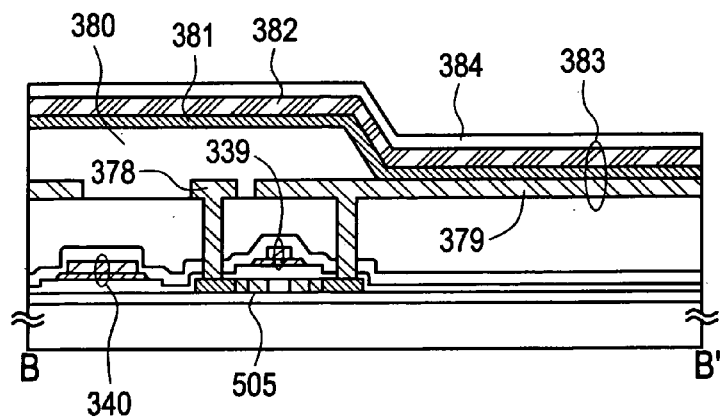
Figure 6C:
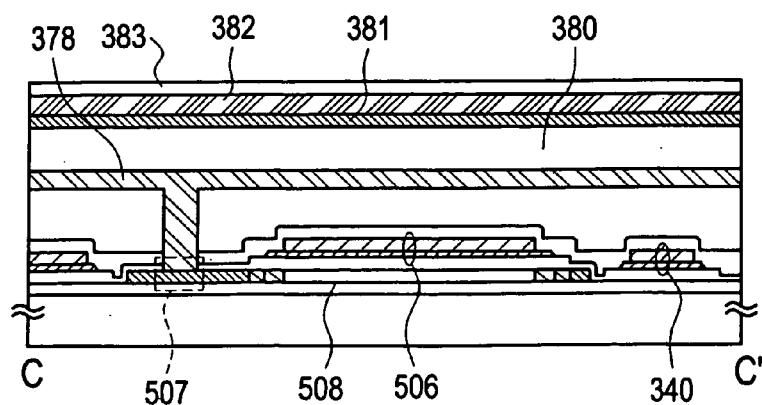

Here, a view of the pixel portion as seen from an upper surface is shown in FIG. 5. FIG. 6(A) is a cross-sectional view taken along a line A–A' in FIG. 5, FIG. 6(B) is a cross-sectional view taken along a line B–B' in FIG. 5 and FIG. 6(C) is a cross-sectional view taken along a line C–C' in FIG. 5. FIG. 6(A) shows the cross-sectional structure of the switching TFT 403, FIG. 6(B) shows the cross-sectional structure of the holding capacity, and FIG. 6(C) shows the cross-sectional structure of the current control TFT 404. The pixel portion shown in these drawings can be formed by the fabrication steps shown in FIG. 2 to FIG. 4 and symbols which are used in FIG. 2 to FIG. 4 are referred when necessary.

First of all, the switching TFT 403 is explained using FIG. 5 and FIG. 6(A). In FIG. 5 and FIG. 6(A), numeral 501 indicates an active layer. Since the detail of the active layer 501 has the constitution which has been explained in conjunction with FIG. 4(B), the explanation thereof is omitted here. The source wiring 340 is electrically connected to the active layer 501 through the wiring 376 and is also electrically connected to the drain wiring 341 through the wiring 377.

Further, a gate electrode 502 is formed on the active layer 501. With respect to the gate electrode 502, portions which are overlapped with the active layer 501 correspond to the gate electrodes 337, 338 in FIG. 2(E). Further, the gate electrode 502 is electrically connected to a gate wiring 504 at a contact portion 503.

Subsequently, the current control TFT 404 is explained in conjunction with FIG. 5 and FIG. 6(B). In FIG. 5 and FIG. 6, numeral 505 indicates an active layer. Since the detail of the active layer 505 has the constitution which has been explained in conjunction with FIG. 4(B), the explanation thereof is omitted here. The source region of the active layer 505 is electrically connected to the wiring (power supply line) 378 and the drain region is electrically connected to the pixel electrode (cathode of the EL element) 379.

Further, the gate electrode 339 is formed on the active layer 505. The gate electrode 339 corresponds to a portion where the drain wiring 341 is superposed on the active layer 505. Further, the drain wiring 341 is directly extended and functions also as an upper electrode 506 of the holding capacity shown in FIG. 6(C). The wiring (power supply line) 378 is electrically connected to a semiconductor film 508 at a contact portion 507 and this semiconductor film 508 functions as a lower electrode of the holding capacity.

Figure 7:
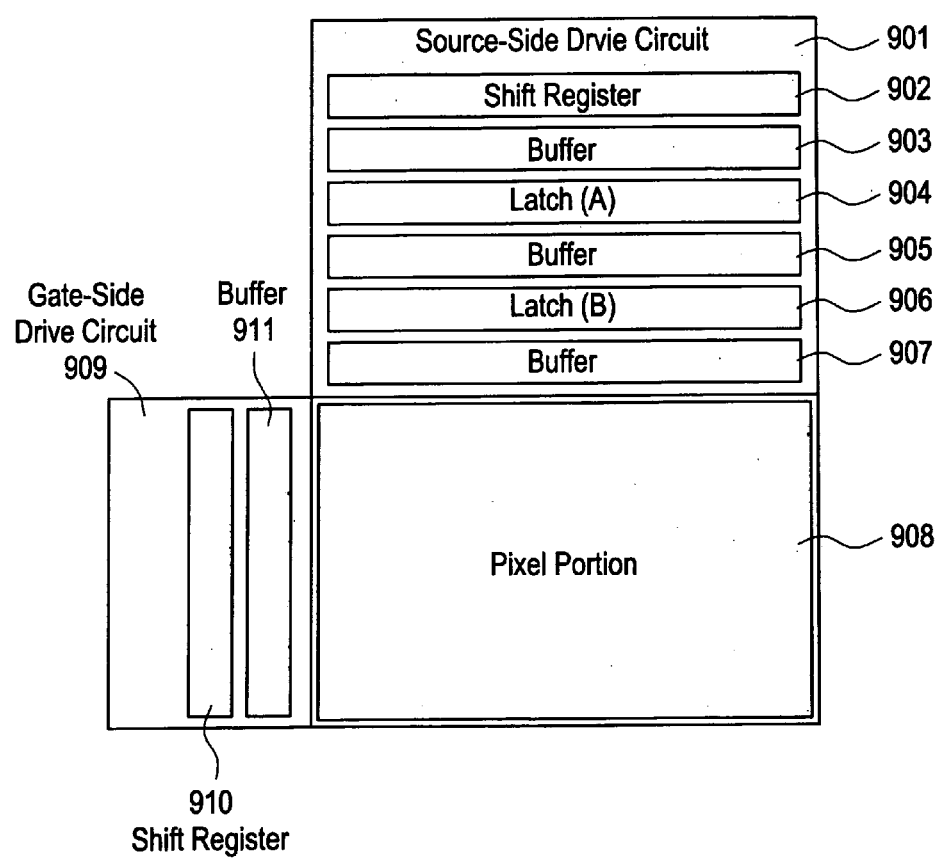
FIG. 7 is a view showing the circuit constitution of an EL light emitting device.

Further, FIG. 7 shows an example of a circuit constitution of the EL light emitting device of this embodiment. In this embodiment, the circuit constitution which performs a digital drive is shown. In this embodiment, the circuit includes a source-side drive circuit 901, a pixel portion 908 and a gate-side drive circuit 909. In the specification, a drive circuit portion is a general term which includes the source-side drive circuit and a gate-side drive circuit.

In this embodiment, an n-channel type TFT having the structure shown in FIG. 4(B) is formed on the pixel portion 908 as a switching TFT and this switching TFT is arranged at a cross point where the gate wiring connected to the gate-side drive circuit 909 and the source wiring connected to the source-side drive circuit 901 cross each other. Further, the drain of the switching TFT is electrically connected to the gate of the p-channel type current control TFT.

The source-side drive circuit 901 includes a shift register 902, a buffer 903, a latch (A) 904, a buffer 905, a latch (B) 906 and a buffer 907. In case of an analog drive, a sampling circuit (transfer gate) may be used in place of the latches (A), (B). Further, the gate-side drive circuit 909 includes a shift register 910 and a buffer 911.

Although not shown in the drawing, a gate-side drive circuit may be further provided at a side opposite to the gate-side drive circuit 909 while sandwiching the pixel portion 908 therebetween. In this case, both gate-side drive circuits have the same structure and share the common gate wiring so that when one gate-side drive circuit is broken down, the remaining gate-side drive circuit transmits gate signals so as to ensure the normal operation of the pixel portion.

The above-mentioned constitution can be easily realized by fabricating the TFTs in accordance with the fabrication steps shown in FIG. 2 to FIG. 4. Further, although only the constitutions of the pixel portion and the drive circuit portion are exemplified in this embodiment, other circuits and components such as a signal division circuit, a D/A converter, an operational amplifier, a logic circuit such as a γ correction circuit can be formed on the same substrate in accordance with the fabrication steps of this embodiment. Further, it is considered that a memory, a microcomputer or the like can be also formed on the same substrate.

Further, the EL light emitting device of this embodiment in the state that the fabrication processing up to the sealing (or filling) step for protecting the EL element has been completed is explained hereinafter in conjunction with FIG. 8(A) and FIG. 8(B). Here, symbols used in FIG. 7 are used when necessary.

Figure 8A:
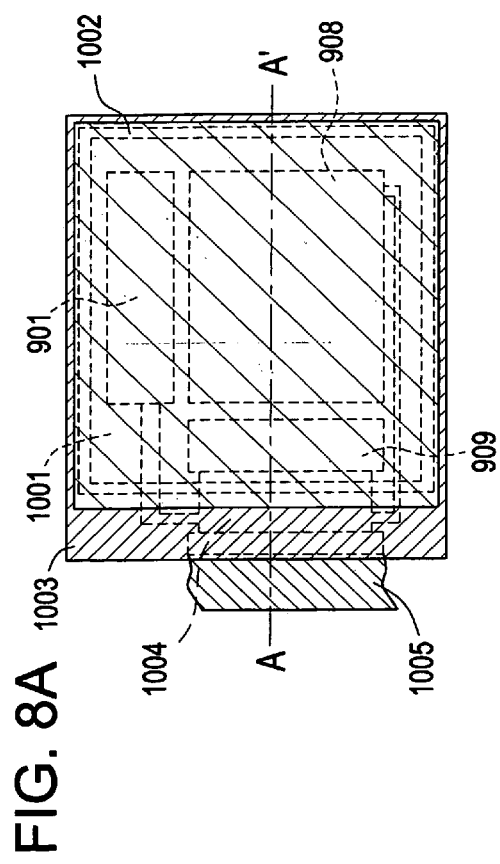
FIGS. 8(A) and 8(B) are views showing an upper surface structure and a cross-sectional structure of the EL light emitting device.

FIG. 8(A) is an upper plan view showing the state that the fabrication processing up to the sealing (or filling) step for protecting the EL element has been completed. Numeral 901 indicates the source-side drive circuit, numeral 908 indicates the pixel portion and numeral 909 indicates the gate-side drive circuit. In the drawing, these circuits and portion are described by a dotted line. Further, numeral 1001 indicates a cover member, numeral 1002 indicates a first seal member, and numeral 1003 indicates a second seal member. A sealing material (not shown in the drawing) is provided between the inner cover member 1001 surrounded by the first seal member 1002 and the substrate on which the EL element is formed.

Numeral 1004 indicates a connection wiring provided for transmitting signals to be inputted to the source-side drive circuit 901 and the gate-side drive circuit 909. The connection wiring 1004 receives video signals and clock signals from a FPC 1005 which constitutes an outside input terminal.

Figure 8B:
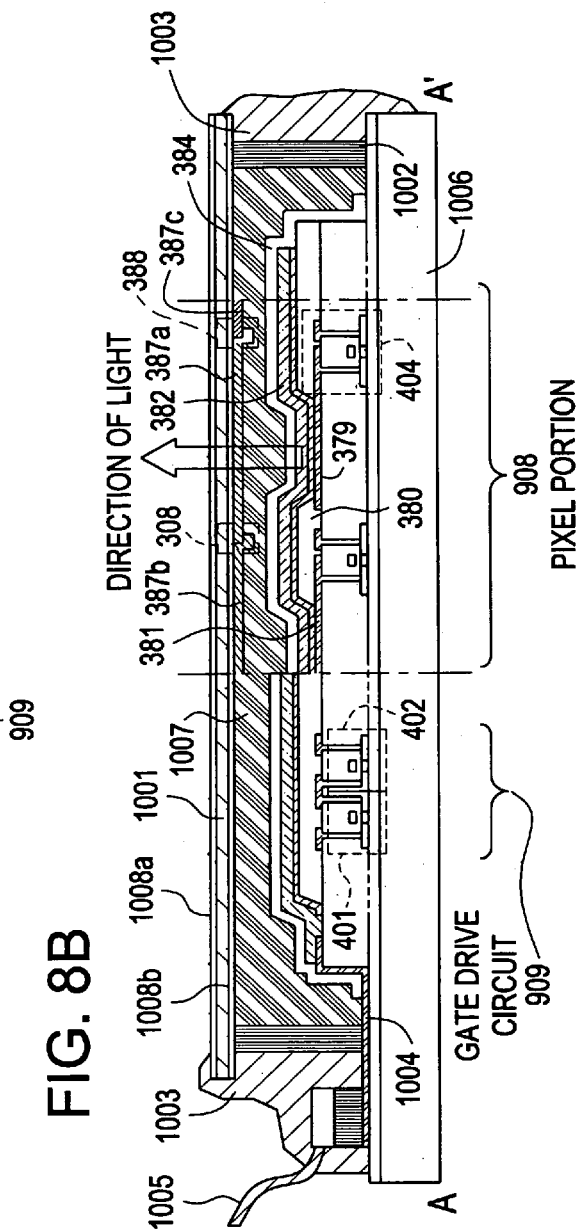

Here, FIG. 8(B) is a cross-sectional view taken along a line A–A' of FIG. 8(A). In FIG. 8(A) and FIG. 8(B), identical parts are indicated by same symbols.

As shown in FIG. 8(B), the pixel portion 908 and the gate-side drive circuit 909 are formed on a glass substrate 1006 and the pixel portion 908 is constituted of the current control TFT 404 and a plurality of pixels including pixel electrodes 379 which are electrically connected to the drain of the current control TFT 404. Further, the gate-side drive electrode 909 is formed of the CMOS circuit which complementarily combines the p-channel type TFT 401 and the n-channel type TFT 402.

The pixel electrodes 379 function as the cathodes of the EL elements. Further, the banks 380 are formed at both sides of the pixel electrode 379 and the EL layer 381 and the anode 382 of the EL element are formed on the pixel electrode 379. The anode 382 also functions as the wiring common to all pixels and is electrically connected to the FPC 1005 through the connection wiring 1004. Further, elements which are included in the pixel portion 908 and the gate-side drive circuit 909 are all covered with the anode 382 and the passivation film 384.

Further, the cover member 1001 is laminated to the sealing material 1007 by the first seal member 1002. A red color coloring layer 387a, a blue color coloring layer 387b and a green color coloring layer (coloring layer which allows wavelengths having the peak in the vicinity of 550 nm to pass therethrough) 387c are formed on the cover member 1001. They are superposed with each other above the source wiring 378 thus forming the light shielding portions 388 above the source wiring 378.

Here, a spacer made of a resin film may be provided for ensuring a gap between the cover member 1001 and the EL element. Then, the sealing material 1007 is filled in the inside of the first seal member 1002. It is preferable to use light curing resin as the first seal member 1002 and the sealing material 1007. Further, it is preferable that the first seal member 1002 is made of a material which prevents the penetration of moisture and oxygen as much as possible. Further, the sealing material 1007 may contain material which has a moisture absorption effect or material which prevents oxidation in the inside thereof.

The sealing material 1007 which is formed such that the sealing material 1007 covers the EL element also functions as an adhesive agent to adhere the cover member 1001. As the sealing material 1007, polyimide, acrylic resin, PVC (polyvinyl chloride), epoxy resin, silicone resin, PVB (polyvinyl butyral) or EVA (ethylene vinyl acetate) can be used.

Further, in this embodiment, as the cover member 1001, a glass plate, a quartz plate, a plastic plate, a ceramic plate, FRP (Fiberglass Reinforced Plastics) plate, a PVF (polyvinyl fluoride) film, a mylar film, a polyester film or an acrylic film can be used.

Still further, according to this embodiment, carbon films (to be more specific, DCL films) 1008a, 1008b having a thickness of 2–30 nm are formed on both surfaces of the cover member 1001. Such carbon films play a role to prevent the intrusion of oxygen and water and to mechanically protect the surfaces of the cover member 1001. It is needless to say that a polarization plate (typically circular polarization plate) may be laminated to the outside carbon film 1008a.

Further, after adhering the cover member 1001 using the sealing material 1007, the second seal member 1003 is formed such that the second seal member 1003 covers a side face (exposed surface) of the sealing material 1007. The second seal member 1003 may be made of the same material as the first seal member 1002.

By sealing the EL element in the sealing material 1007 with the above-mentioned structure, it becomes possible to completely shield the EL element from the outside so that the intrusion of the substances such as moisture, oxygen or the like which accelerates the deterioration due to the oxidation of the EL layer from the outside can be prevented. Accordingly, the EL light emitting device having high reliability can be fabricated.

Embodiment 2

Figure 10:
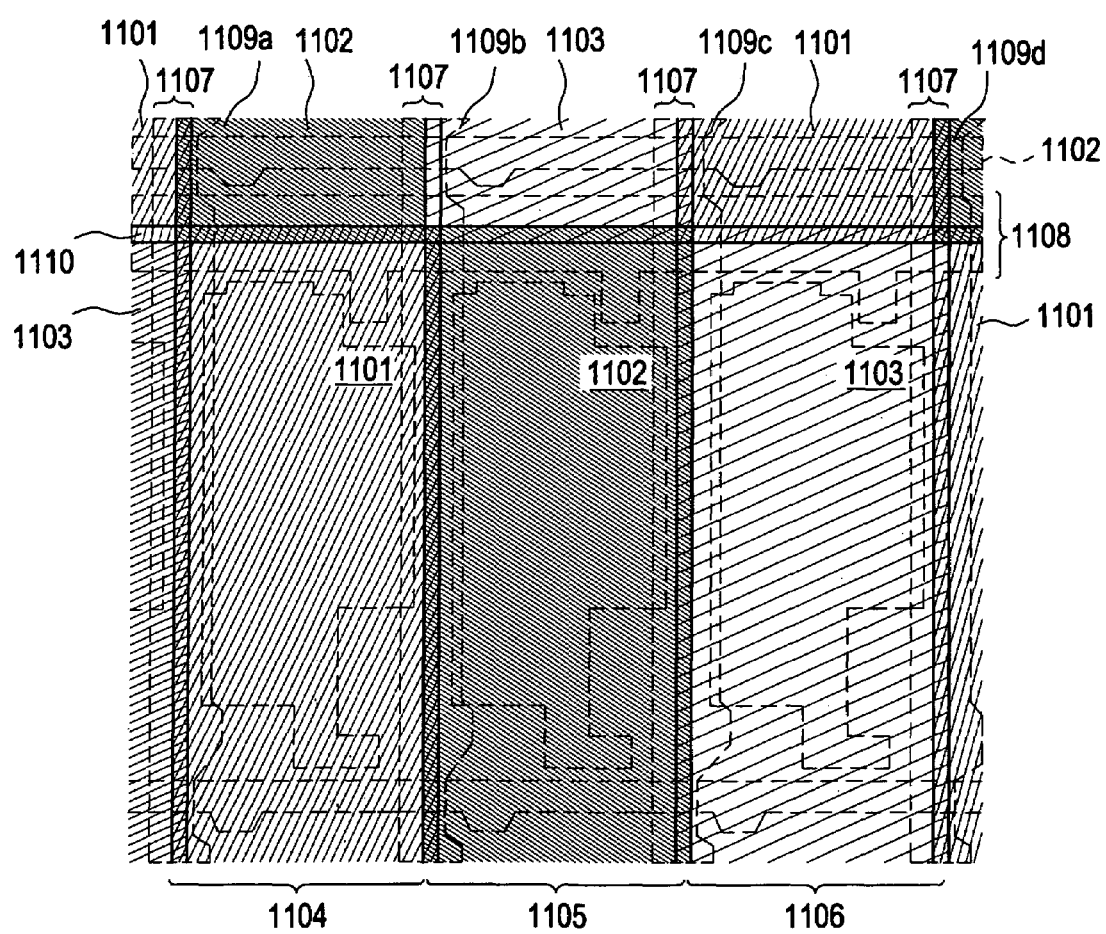
FIG. 10 is a view showing an upper surface structure of a pixel portion.

This embodiment explains an example of the arrangement of coloring layers in conjunction with FIG. 10. FIG. 10 is a view of the pixel portion as seen from an upper surface. Each pixel has the structure which has been explained in conjunction with FIG. 5, FIG. 6(A) to FIG. 6(C).

In FIG. 10, numeral 1103 indicates a red coloring layer, numeral 1101 indicates a green coloring layer, numeral 1102 indicates a blue coloring layer. Further, numeral 1104 indicates a pixel which emits green light, numeral 1105 indicates a pixel which emits blue light and numeral 1106 indicates a pixel which emits red light. In this embodiment, the red coloring layer 1103 is formed on the pixel 1106 which emits red light, the blue coloring layer 1102 is formed on the pixel 1105 which emits blue light, and the green coloring layer 1101 is formed on the pixel which emits green light.

Further, the red coloring layer 1103, the green coloring layer 1101 and the blue coloring layer 1102 are superposed with each other above each source wiring 1107 and current supply line 1108 thus forming light shielding portions 1109a–1109d and 1110. In this manner, each pixel is surrounded by the light shielding portions 1109a–1109d and the 1110 and hence, among light generated and emitted at each pixel, light which reaches the light shielding portions 1109a–1109d and the 1110 is absorbed therein. That is, the color mixing between the neighboring pixels can be effectively suppressed.

It is effective to make each coloring layer contain black pigment or carbon particles. Due to such a provision, light from outside is absorbed and hence, a drawback that a viewer who observes an image is reflected on the cathode made of a metal film can be reduced. However, when the addition amount of the black pigment or carbon particles becomes excessively large, a quantity of emitting light becomes small. Accordingly, it is preferable to set an addition amount of the black pigment or carbon particles to 1–10%.

This embodiment can be carried out in combination with the embodiment 1.

Embodiment 3

In the embodiment 1, an example was presented in which an EL material, from which white light emission can be obtained, was used as the light emitting layer included in an EL layer. The white light being emitted was then provided to pass through the red colored layer, the green colored layer, and the blue colored layer to obtain red light, green light, and blue light, respectively.

In this embodiment, light emitting layers which can obtain red light emission, green light emission, and blue light emission are formed as pixels for developing red, green, and blue, respectively. The red light, the green light, and the blue light emitted from the respective light emitting layers are made to pass through the red colored layer, the green colored layer, and the blue colored layer, respectively, to improve purity of each color.

In this embodiment, it is necessary to deposit three kinds of EL materials respectively providing emissions of red, green and blue. For this purpose, however, known materials can be used. In addition, it is also necessary to carry out the deposition separately for each kind of the pixel. This can be carried out by depositing a low-molecular group EL material with a vapor deposition method using shadow masks, or by depositing a high-molecular group EL material with an ink jet method or a printing method.

The constitution according to this embodiment can be implemented in being freely combined with that according to the embodiment 1 or embodiment 2. Moreover, as shown in the embodiment 2, it is effective to make each of the colored layers contain a black pigment or carbon particles.

Embodiment 4

In this embodiment, an example was presented in which an EL material, from which blue light emission or bluish green light emission can be obtained, was used as the light emitting layer. The emitted light was then made pass through a color conversion layer for obtaining red light, green light, or blue light.

In this embodiment, for a pixel developing red color, there is formed a conversion layer for converting blue light to red light, and for a pixel developing green color, a conversion layer for converting blue light to green light. The color conversion layers can be provided by using known ones. The blue light emitted from the light emitting layer excites the color conversion layer to emit red light or green light.

Furthermore, the red light and the green light emitted from the respective color conversion layers, and the blue color emitted from the light emitting layer are made to pass through the red colored layer, the green colored layer, and the blue colored layer, respectively, to improve purity of each color.

In this embodiment, it is necessary only to deposit the light emitting layer by which emission of blue or bluish green light is obtained. Therefore, it is preferable to deposit the light emitting layer by a simple technique such as a spin coat method or a printing method. Of course, the light emitting layer can be deposited by the vapor deposition method.

Note that the constitution according to this embodiment can be implemented in being freely combined with that according to the embodiment 1 or embodiment 2. Moreover, as shown in the embodiment 2, it is effective to make each of the colored layers contain a black pigment or carbon particles.

Embodiment 5

This embodiment describes an EL light emitting device having pixel portions which differ in structure from those of the EL light emitting device of the embodiment 1. The EL light emitting device of this embodiment substantially has the same TFT structure and EL element structure as those of the first embodiment 1 except for a point that layers on which various wiring (gate wiring, source wiring, drain wiring or current supply line or the like) are formed. Accordingly, parts which are identical with those of the embodiment 1 are quoted by the symbols which are used in FIG. 5 and FIG. 6(A) to FIG. 6(C).

Figure 11:
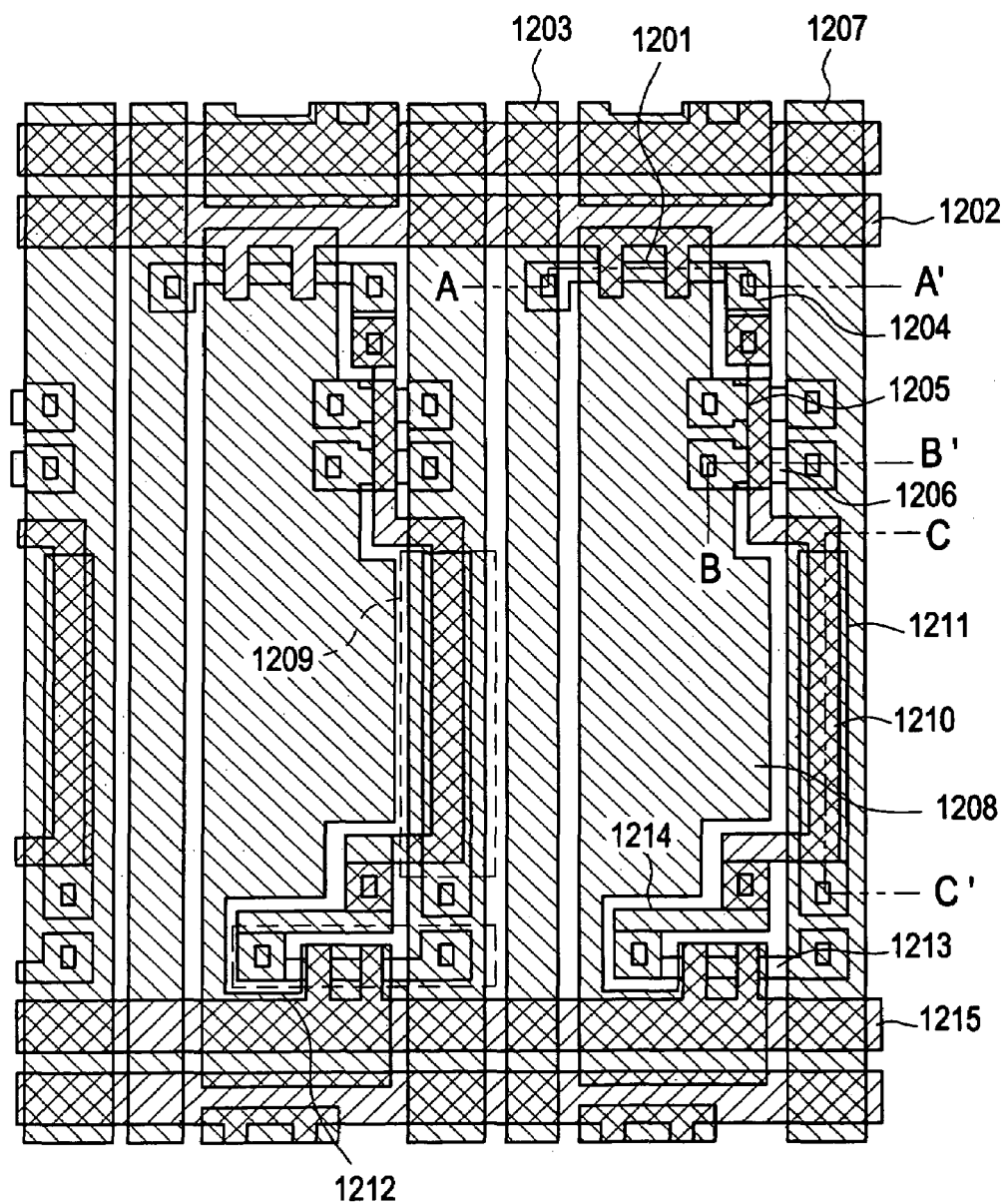
FIG. 11 is a view showing the upper surface structure of the pixel portion.
Figure 12A:
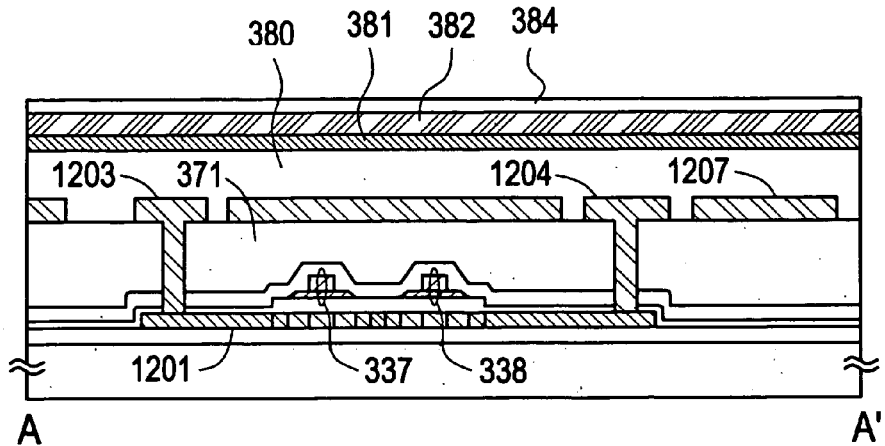
FIGS. 12(A) to 12(C) are views showing cross-sectional structures of the pixel portions.
Figure 12B:
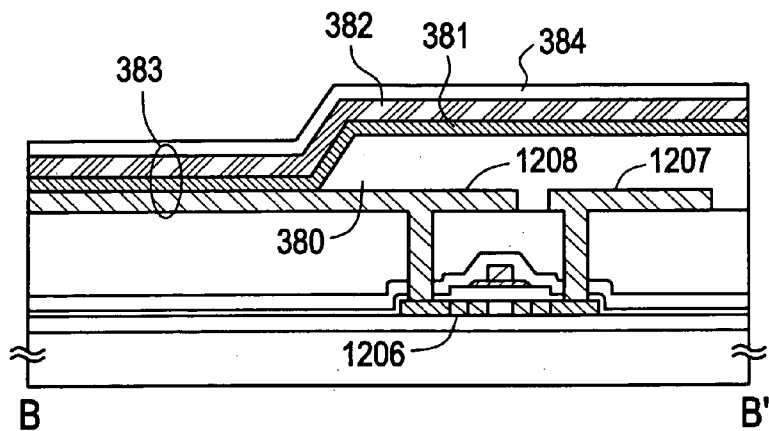
Figure 12C:
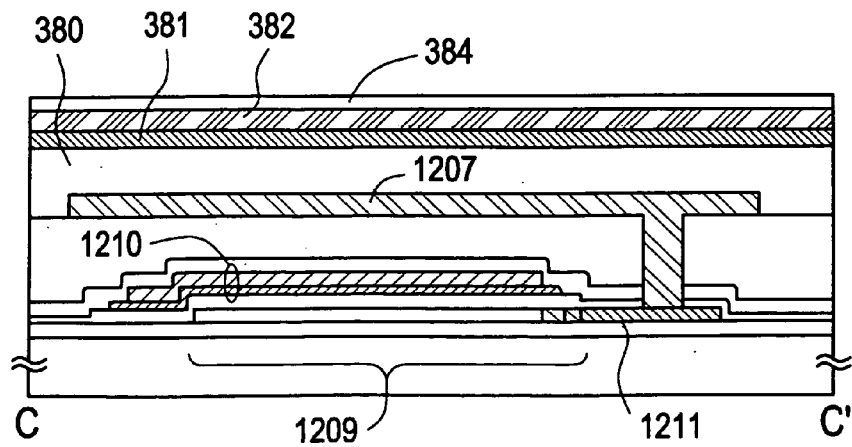

Here, FIG. 11 is a view showing a pixel portion as seen from an upper surface. FIG. 12(A) is a cross-sectional view taken along a line A–A' in FIG. 11, FIG. 12(B) is a cross-sectional view taken along a line B–B' in FIG. 11 and FIG. 12(C) is a cross-sectional view taken along a line C–C' in FIG. 11. FIG. 12(A) shows the cross-sectional structure of a switching TFT, FIG. 12(B) shows the cross-sectional structure of the holding capacity, and FIG. 12(C) shows the cross-sectional structure of a current control TFT. The pixel portion shown in these drawings can be formed by referring to the fabrication steps shown in FIG. 2 to FIG. 4.

First of all, the switching TFT is explained in conjunction with FIG. 11 and FIG. 12(A). In FIG. 11 and FIG. 12(A), numeral 1201 indicates an active layer. Since the detail of the active layer 1201 is as same as that of the switching TFT explained in FIG. 4(B), the explanation thereof is omitted here. A gate wiring 1202 is superposed on the active layer 1201 and functions as the gate electrode. Then, a source wiring 1203 and a drain wiring 1204 are connected to the active layer 1201 and the drain wiring 1204 is connected to a gate wiring 1205 of the current control TFT.

Subsequently, the current control TFT is explained in conjunction with FIG. 11 and FIG. 12(B). Although the current control TFT has the structure in which two TFTs are connected in parallel, the explanation here is made with respect to one of them. In FIG. 11 and FIG. 12(B), numeral 1206 indicates an active layer. Since the detail of the active layer 1206 is as same as that of the current control TFT explained in FIG. 4(B), the explanation thereof is omitted here. A source region of the active layer 1206 is connected to a current supply line 1207 and a drain region is connected to a pixel electrode (cathode of EL element) 1208.

Further, the gate wiring 1205 of the current control TFT also works as an upper electrode 1210 of a holding capacity 1209 shown in FIG. 12(C) disposed right below the current supply line 1207. Here, the current supply line 1207 is electrically connected to a semiconductor film 1211 and this semiconductor film 1211 functions as the lower electrode of the holding capacity 1209. With the provision of the structure of this embodiment, since the holding capacity 1209 is completely concealed under the current supply line 1207, there is no possibility that the effective light emitting area of the pixel is narrowed.

Subsequently, a canceling TFT is explained. The pixel of this embodiment is provided with the canceling TFT 1212 having the same structure as the switching TFT. In an active layer 1213 of the canceling TFT 1212, a source region is connected to a current supply line 1207 and a drain region is electrically connected to a gate wiring 1205 of the current control TFT through a drain wiring 1214. Here, since the structure of the active layer 1213 is substantially equal to that of the switching TFT, the explanation thereof is omitted here.

Further, a gate wiring of the canceling TFT (called "canceling gate wiring" hereinafter) 1215 is arranged parallel to the gate wiring 1202 of the switching TFT.

When the canceling gate wiring 1215 receives a signal which makes the canceling TFT 1212 the "ON" state, the gate wiring 1205 of the current control TFT is forced to take the equal potential as that of the current supply line 1207. That is, since the current control TFT becomes the "OFF" state, the supply of electricity to the EL element 383 is cut and hence, the light emitting is stopped and the lighting by the pixel is turned off.

In this manner, by forcibly turning off the lighting of the pixel with the provision of the canceling TFT 1212, the controllability of the lighting time of the pixel can be enhanced. That is, the gradation in the image display of the time gradation system can be easily increased. With respect to the EL light emitting device which adopts such a canceling TFT, Japanese Patent Laid-open No.338786/1999 may be referred.

Further, the constitution of this embodiment can be carried out in free combination with any one of the embodiments 2 to 4.

Embodiment 6

In this embodiment, an example of manufacturing an EL light emitting device by manufacturing steps different from that for the embodiment 1 will be explained with reference to FIG. 13. Since this embodiment only differs from the embodiment 1 in the intermediate manufacturing steps, the reference numerals used in the description of the embodiment 1 will be referred if necessary.

First, according to the manufacturing steps in the embodiment 1, the EL light emitting device is manufactured up to the step shown in FIG. 2E. In this embodiment, however, the doping step of an n-type impurity element shown in FIG. 2C is omitted. Thus, the state shown in FIG. 13A is obtained.

Next, as shown in FIG. 13B, after the resist masks 311a to 311e are removed, the semiconductor film is doped with an n-type impurity element (in this embodiment, phosphorus). Note that the doping step of the n-type impurity element can be carried out under the same condition as that of the doping step shown in FIG. 3A in the embodiment 1.

In this way, there are formed n-type impurity regions (b) 601 to 609 and n-type impurity regions (c) 610 to 619. Concentrations of the n-type impurity element contained in the n-type impurity regions (b) 601 to 609 and the n-type impurity regions (c) 610 to 619 are the same as those in the embodiment 1.

Figure 13C:
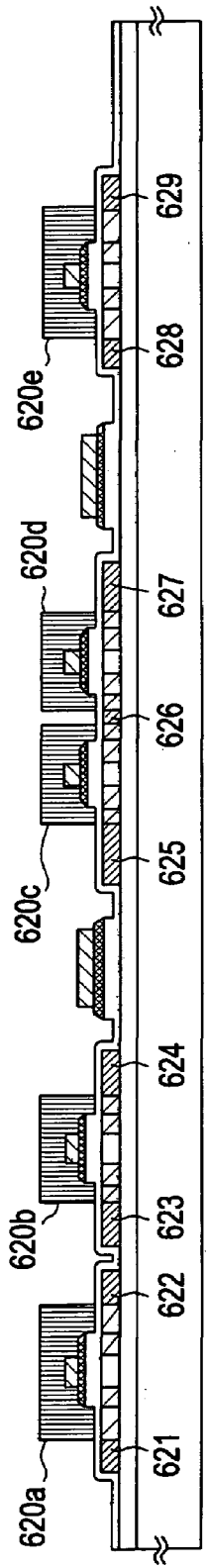

Subsequent to this, resist masks 620a to 620e are formed and an n-type impurity element (in this embodiment, phosphorus) is added for doping the semiconductor film like in the doping step shown in FIG. 2C in the embodiment 1. In this way, there are formed n-type impurity regions (a) 621 to 629. Concentrations of the n-type impurity element contained in the n-type impurity regions (a) 621 to 629 are the same as those in the embodiment 1 (FIG. 13C).

At this time, in each of the n-type impurity regions (b) 601 to 609, a portion covered with corresponding one of the resist masks 620a to 620e functions as an LDD (light-doped drain) region later. The length of each n-type impurity region (b) (LDD length) that will function later as the LDD region can be freely adjusted by adjusting the length of corresponding one of the resist masks 620a to 620e. Therefore, this embodiment is characterized in that it is excellent in controllability of the LDD length.

Figure 13D:
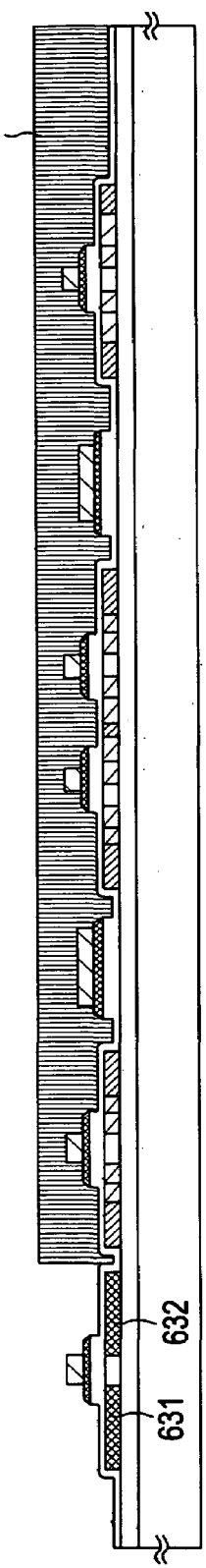

Then, the resist masks 620a to 620e are removed and a resist mask 630 is newly formed. Then, a p-type impurity element (in this embodiment, boron) is added similarly to the doping step in the embodiment 1 as shown in FIG. 3B. Thus, there are formed p-type impurity regions (a) 631 to 632. Concentrations of the p-type impurity element contained in the p-type impurity regions (a) 631 to 632 are the same as those in the embodiment 1 (FIG. 13D).

Thereafter, an EL light emitting device may be manufactured according to the steps subsequent to the activation step of the embodiment 1 shown in FIG. 3C. Moreover, the structure of the completed TFT is approximately the same as that of the embodiment 1, which can be therefore referred to the explanation of the completed TFT in this embodiment. The constitution according to this embodiment can be implemented in being freely combined with those according to any one of the embodiments 1 through 5.

Embodiment 7

In this embodiment, explanation will be made by using FIG. 14 about an example of manufacturing an EL light emitting device by manufacturing steps different from that for the embodiment 1. Since this embodiment only differs from the embodiment 1 in the intermediate manufacturing steps, the reference numerals used in the description of the embodiment 1 will be referred, if necessary.

Figure 14A:
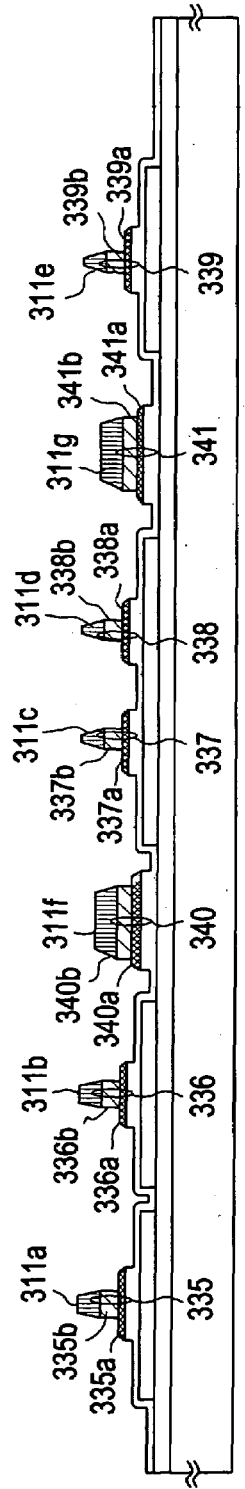
FIGS. 14(A) to 14(D) are views showing a fabrication step of the pixel portion and the drive circuit.

First, according to the manufacturing steps in the embodiment 1, the EL light emitting device is manufactured up to the step shown in FIG. 2E. In this embodiment, however, the doping step of an n-type impurity element shown in FIG. 2C is omitted. Thus, the state shown in FIG. 14A is obtained.

Figure 14B:
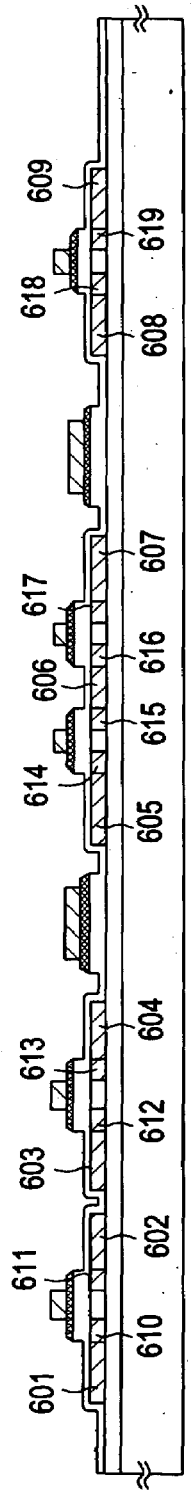

Next, as shown in FIG. 14B, after the resist masks 311a to 311e are removed, an n-type impurity element (in this embodiment, phosphorus) is doped. The doping step of the n-type impurity element can be carried out under the same condition as that of the doping step shown in FIG. 3A in the embodiment 1.

In this way, there are formed n-type impurity regions (b) 601 to 609 and n-type impurity regions (c) 610 to 619. Concentrations of the n-type impurity element contained in the n-type impurity regions (b) 601 to 609 and the n-type impurity regions (c) 610 to 619 are the same as those in the embodiment 1.

Figure 14C:
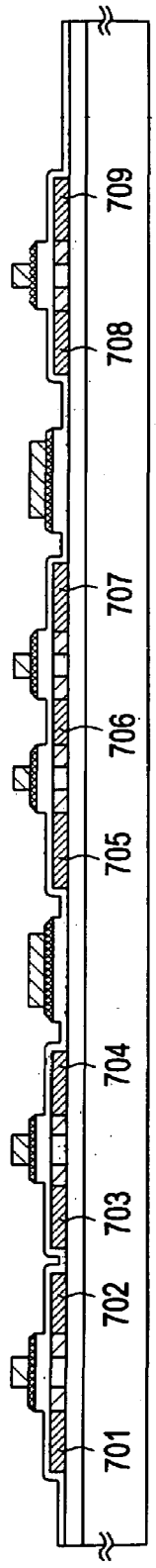

Subsequent to this, with the gate electrodes 335 to 339 used as masks, the semiconductor film is doped with an n-type impurity element (in this embodiment, phosphorus) like in the doping step shown in FIG. 2C in the embodiment 1. In this way, there are formed n-type impurity regions (a) 701 to 709. Concentrations of the n-type impurity element contained in the n-type impurity regions (a) 701 to 709 are the same as those in the embodiment 1 (FIG. 14C).

Figure 14D:
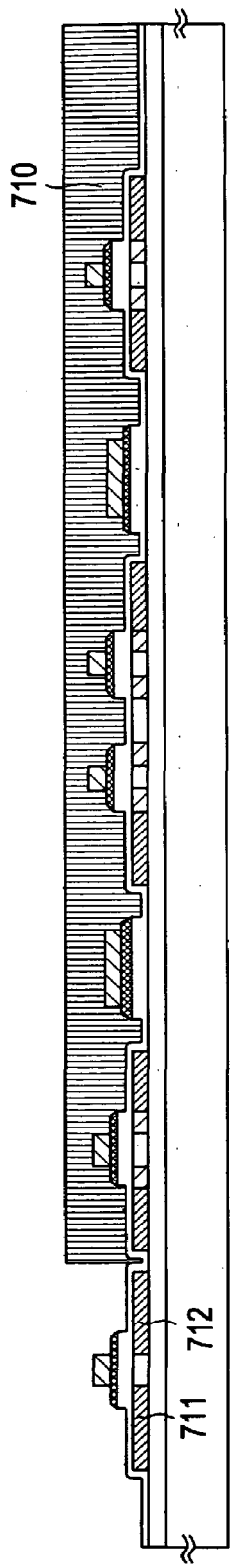

Following this, with a resist mask 710 formed, a p-type impurity element (in this embodiment, boron) is added similarly to the doping step in the embodiment 1 as shown in FIG. 3B. Thus, there are formed p-type impurity regions (a) 711 to 714. Concentrations of the p-type impurity element contained in the p-type impurity regions (a) 711 to 714 are the same as those in the embodiment 1 (FIG. 14D).

Thereafter, an EL light emitting device can be manufactured according to the steps subsequent to the activation step of the embodiment 1 shown in FIG. 3C. Moreover, the structure of the completed TFT is approximately the same as that of the embodiment 1, which can be therefore referred to the explanation of the completed TFT in this embodiment. The constitution according to this embodiment can be embodied in being freely combined with those according to any one of the embodiments 1 through 5.

Embodiment 8

In the embodiment 1, a resin film is used as the interlayer insulating film 371, however, in this embodiment, an insulating film containing silicon, specifically, a silicon oxide film is used. In this case, after the fabrication steps have been completed up to that shown in FIG. 3B, a protection film (in this embodiment, a silicon oxinitride film) of 100 to 200 nm in thickness is first formed so as to cover the gate electrode.

Next, in the same way as the step shown in FIG. 3C, the activation step is carried out, and an interlayer insulating film (in this embodiment, a silicon oxide film) of 800 nm to 1 μm in thickness is subsequently provided. In this embodiment, prior to forming the interlayer insulating film, a heat treatment is carried out in an atmosphere containing 3 to 100% hydrogen at 350 to 500° C. for terminating dangling bonds in the active layer with excited hydrogen atoms.

After these steps, there are formed on the above interlayer insulating film a source wiring and a drain wiring, which are covered with a passivation film. In this embodiment, a silicon nitride film or a silicon oxinitride film is used as the passivation film.

The constitution according to this embodiment can be implemented in being freely combined with those according to any one of the embodiments 1 through 7.

Embodiment 9

Figure 9A:
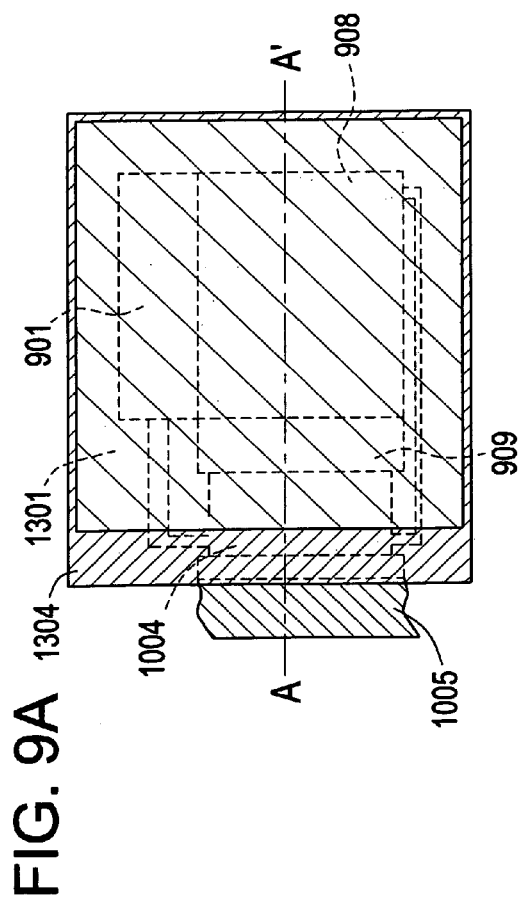
FIG. 9(A) is a view showing an upper surface structure and FIG. 9(B) is a cross-sectional structure of the EL light emitting device.
Figure 9B:
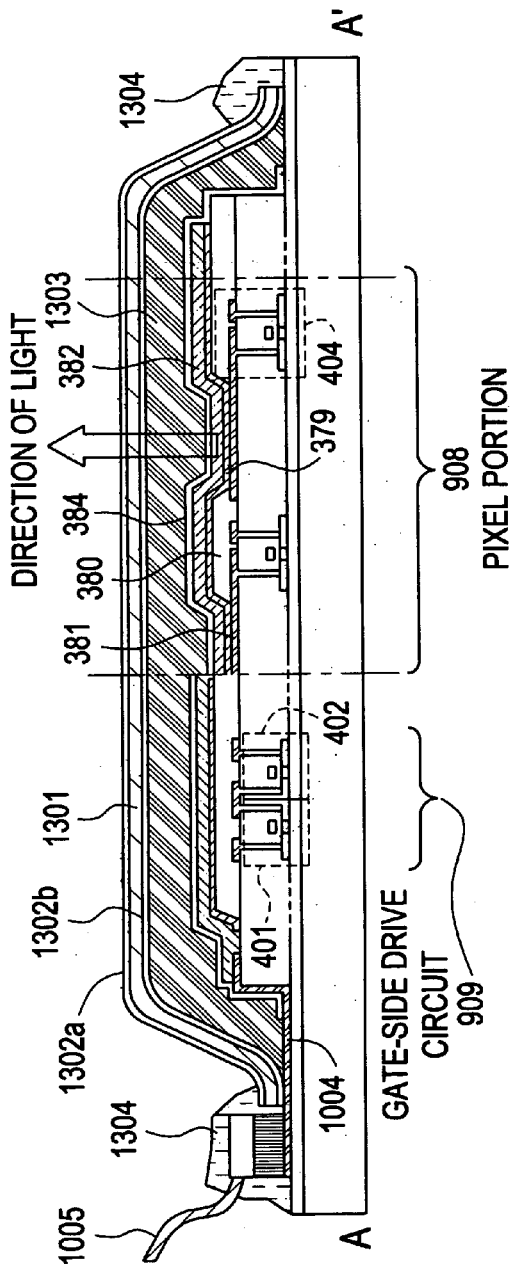

In this embodiment, explanation will be made by using FIG. 9 about an example of sealing an EL element with a structure different from that of the EL display device in the embodiment 1. The parts being the same as those shown in FIG. 8 are denoted by the same reference numerals.

In this embodiment, as a cover material 1301, a plastic film is used with DLC films 1302a and 1302b respectively formed on both faces thereof. When the DLC films are formed on both faces of the plastic film, a roll-to-roll method can be employed by which the DLC films are formed with the plastic film wound onto a roll.

In this embodiment, on a substrate manufactured so far as the EL element is provided thereon according to the manufacturing steps in the embodiment 1, a cover material 1301 is bonded by using a sealing material 1303. The end of the cover material 1301 is sealed by a sealant 1304. With respect to the sealing material 1303 and the sealant 1304, the same materials as those presented in the embodiment 1 can be used.

The constitution according to this embodiment can be implemented in being freely combined with those according to any one of the embodiments 1 through 8.

Embodiment 10

In this embodiment, an explanation will be made about circuit diagram for the pixel structures shown in FIG. 5 in the embodiment 1, and the pixel structure shown in FIG. 11 in the embodiment 5. Here, a circuit diagrams corresponding to the structures shown in FIG. 5 and FIG. 11 are shown in FIG. 15A and FIG. 15B, respectively.

Figure 15A:
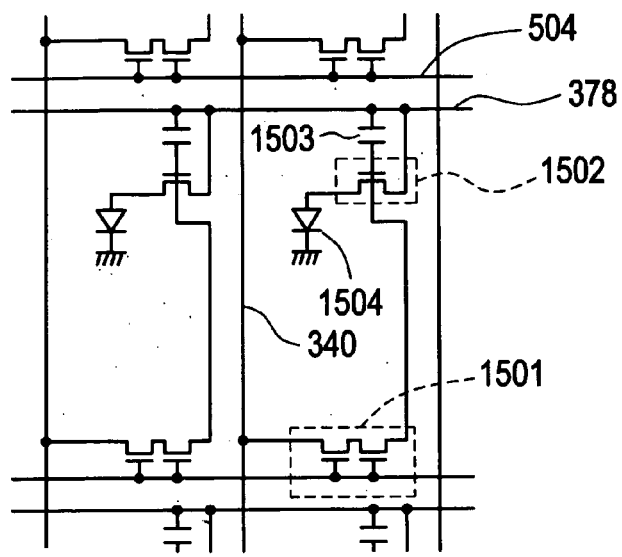
FIGS. 15(A) and 15(B) are views showing the circuit constitution of the pixel.

In FIG. 15A, reference numerals 340, 378, and 504 denote the source wiring, the current supply line, and the gate wiring, respectively. The reference numerals correspond to those in FIG. 5. Furthermore, reference numerals 1501, 1502, 1503, and 1504 denote a switching TFT corresponding to that shown in FIG. 6A, a current controlling TFT corresponding to that shown in FIG. 6B, a holding capacitor corresponding to that shown in FIG. 6C, and an EL element, respectively.

Digital driving of the pixel described in this embodiment can be carried out according to the driving method disclosed in JP2000-114592.

Figure 15B:
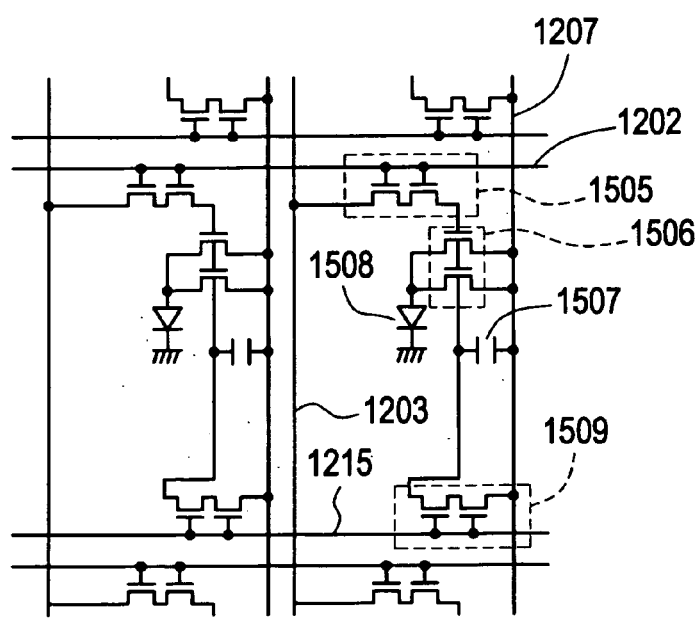

In FIG. 15B, reference numerals 1203, 1207, and 1202 denote a source wiring, a current supply line, and a gate wiring, respectively. The reference numerals correspond to those in FIG. 11. Furthermore, reference numerals 1505, 1506, 1507, 1508, and 1509 denote a switching TFT corresponding to that shown in FIG. 12A, a current controlling TFT corresponding to that shown in FIG. 12B, a holding capacitor corresponding to that shown in FIG. 12C, an EL element, and an erasing TFT, respectively.

Digital driving of the pixel in this embodiment can be carried out according to the driving method disclosed in JP11-338786.

The constitution according to this embodiment can be implemented in being freely combined with those according to any one of the embodiments 1 through 9.

Embodiment 11

Figure 16:
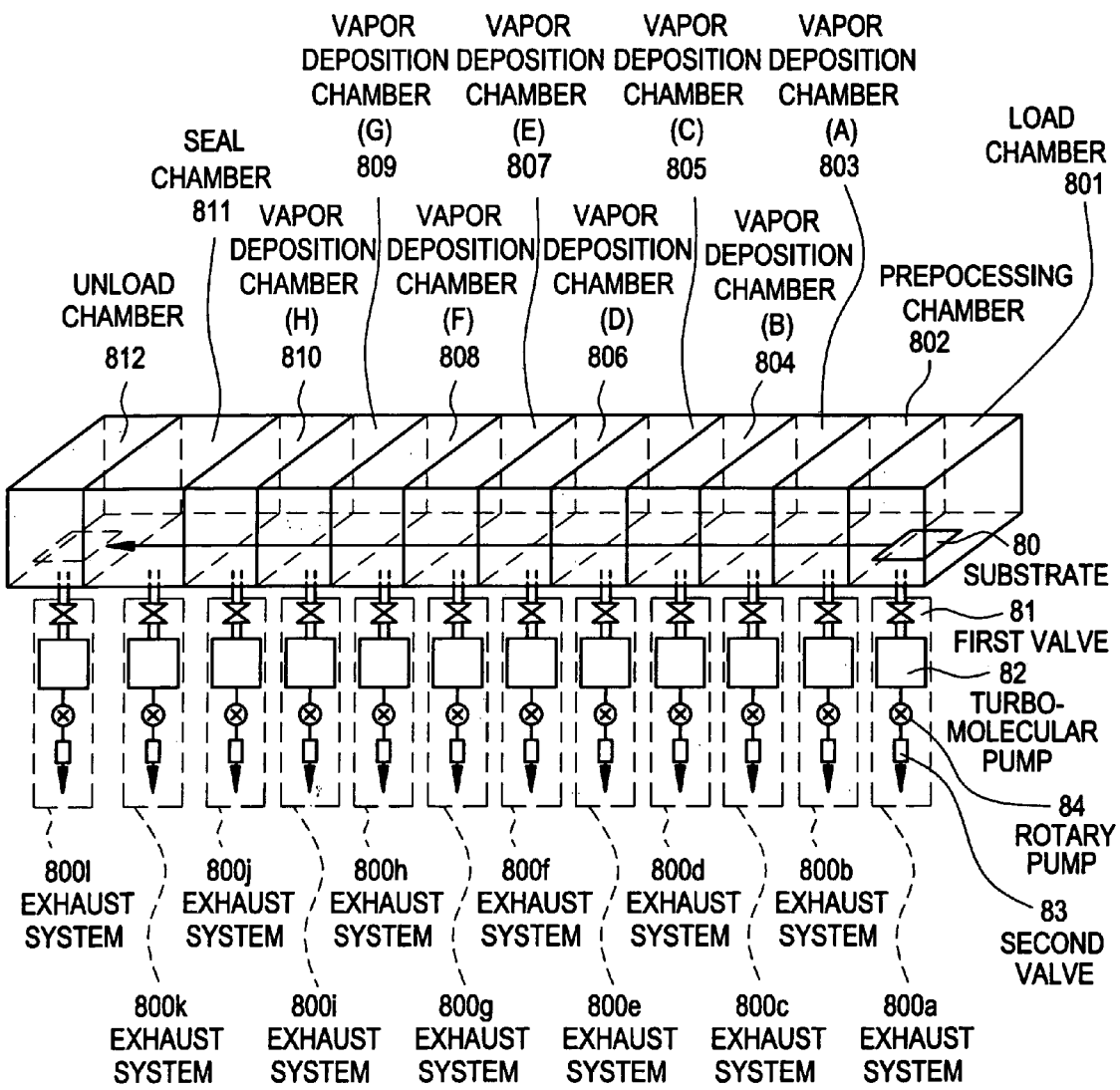
FIG. 16 is a view showing the constitution of an in-line system film forming device.

FIG. 16 shows an example of a film forming device to form the EL element in carrying out the present invention. In this embodiment, a case in which an in-line type film forming device is used as the film forming device is explained. In FIG. 16, numeral 801 indicates a load chamber and a substrate 80 is delivered from this load chamber 801. The load chamber 801 is provided with an exhaust system 800a and the exhaust system 800a is constituted of a first valve 81, a turbo-molecular pump 82, a second valve 83 and a rotary pump (hydraulic rotary pump) 84.

The first valve 81 constitutes a main valve and works also as a conductance valve in some cases and also works as a butterfly valve in some other cases. The second valve 83 is a fore valve. In operation, first of all, the second valve 83 is opened and the pressure inside the load chamber 801 is roughly reduced by the rotary pump 84. Subsequently, the first valve 81 is opened and the pressure inside the load chamber 801 is reduced to the high vacuum state by the turbo molecular pump 82. Although a mechanical booster pump or a cryopump can be used in place of the turbo molecular pump, the cryopump is particularly effective in the removal of the moisture.

Subsequently, numeral 802 indicates a preprocessing chamber for processing a surface of an anode or a cathode (cathode in this embodiment) of the EL element. The preprocessing chamber 802 is provided with an exhaust system 800b. Further, the preprocessing chamber 802 is hermetically shielded from the load chamber 801 by a gate not shown in the drawing. The preprocessing chamber 802 may be changed in various forms depending on the fabrication process of the EL element.

As the preprocessing, ozone plasma processing, oxygen plasma processing, argon plasma processing, neon plasma processing, helium plasma processing or hydrogen plasma processing can be performed. Further, with the provision of a heater, the heating can be performed simultaneous with the plasma processing. Still further, with the provision of an ultraviolet ray lamp, the irradiation of ultraviolet rays can be performed.

In this embodiment, the argon plasma processing is performed on a surface of the cathode made of a metal film while heating the substrate at a temperature of 100° C. and hence, the preprocessing which enables the removal of moisture and the removal of an oxide film naturally formed on a surface of the electrode can be carried out simultaneously.

Subsequently, numeral 803 indicates a vapor deposition chamber for forming a film of organic material by a vapor deposition method and this chamber is called as a vapor deposition chamber (A). The vapor deposition chamber (A) 803 is provided with an exhaust system 800c. Further, the vapor deposition chamber (A) 803 is hermetically shielded from the preprocessing chamber 802 by a gate not shown in the drawing. In this embodiment, the electron injection layer is formed in the vapor deposition chamber (A) 803.

Subsequently, numeral 804 indicates a vapor deposition chamber for forming a film of organic material by a vapor deposition method and this chamber is called as a vapor deposition chamber (B). The vapor deposition chamber (B) 804 is provided with an exhaust system 800d. Further, the vapor deposition chamber (B) 804 is hermetically shielded from the vapor deposition chamber (A) 803 by a gate not shown in the drawing. In this embodiment, an electron transport layer is formed in the vapor deposition chamber (B) 804.

Subsequently, numeral 805 indicates a vapor deposition chamber for forming a film of organic EL material by a vapor deposition method and this chamber is called as a vapor deposition chamber (C). The vapor deposition chamber (C) 805 is provided with an exhaust system 800e. Further, the vapor deposition chamber (C) 805 is hermetically shielded from the vapor deposition chamber (B) 804 by a gate not shown in the drawing. In this embodiment, a light emitting layer which emits red light is formed in the vapor deposition chamber (C) 805.

Subsequently, numeral 806 indicates a vapor deposition chamber for forming a film of organic EL material by a vapor deposition method and this chamber is called as a vapor deposition chamber (D). The vapor deposition chamber (D) 806 is provided with an exhaust system 800*f*. Further, the vapor deposition chamber (D) 806 is hermetically shielded from the vapor deposition chamber (C) 805 by a gate not shown in the drawing. In this embodiment, a light emitting layer which emits green light is formed in the vapor deposition chamber (D) 806.

Subsequently, numeral 807 indicates a vapor deposition chamber for forming a film of organic EL material by a vapor deposition method and this chamber is called as a vapor deposition chamber (E). The vapor deposition chamber (E) 807 is provided with an exhaust system 800*g*. Further, the vapor deposition chamber (E) 807 is hermetically shielded from the vapor deposition chamber (D) 806 by a gate not shown in the drawing. In this embodiment, a light emitting layer which emits blue light is formed in the vapor deposition chamber (E) 807.

Subsequently, numeral 808 indicates a vapor deposition chamber for forming a film of organic material by a vapor deposition method and this chamber is called as a vapor deposition chamber (F). The vapor deposition chamber (F) 808 is provided with an exhaust system 800*h*. Further, the vapor deposition chamber (F) 808 is hermetically shielded from the vapor deposition chamber (E) 807 by a gate not shown in the drawing. In this embodiment, a hole transport layer is formed in the vapor deposition chamber (F) 808.

Subsequently, numeral 809 indicates a vapor deposition chamber for forming a film of organic material by a vapor deposition method and this chamber is called as a vapor deposition chamber (G). The vapor deposition chamber (G) 809 is provided with an exhaust system 800*i*. Further, the vapor deposition chamber (G) 809 is hermetically shielded from the vapor deposition chamber (F) 808 by a gate not shown in the drawing. In this embodiment, a hole injection layer is formed in the vapor deposition chamber (G) 809.

Subsequently, numeral 810 indicates a vapor deposition chamber for forming a conductive film which constitutes an anode or a cathode of the EL element (oxide conductive film which constitutes the anode in this embodiment) by a vapor deposition method and this chamber is called as a vapor deposition chamber (H). The vapor deposition chamber (H) 810 is provided with an exhaust system 800*j*. Further, the vapor deposition chamber (H) 810 is hermetically shielded from the vapor deposition chamber (G) 809 by a gate not shown in the drawing.

In this embodiment, an oxide conductive film which dopes oxide gallium into zinc oxide is formed in the vapor deposition chamber (H) 810 as an oxide conductive film which constitutes the anode of the EL element.

Subsequently, numeral 811 indicates a seal chamber which is provided with an exhaust system 800*k*. Further, the seal chamber 811 is hermetically shielded from the vapor deposition chamber (H) 810 by a gate not shown in the drawing. In the seal chamber 811, as a passivation film which protects the EL element from oxygen and moisture, a DLC (Diamond-like Carbon) film is formed. It is needless to say that a silicon nitride film or a silicon nitride-oxide film (SION film) can be formed.

A sputter method or a plasma CVD method may be used for forming the DLC film. Since the DLC film can be formed in a temperature range from a room temperature to not more than 100° C., it is preferable as the passivation film which protects the EL element having a low heat resistance. Further, since the DLC film exhibits the high thermal conductivity and the heat radiation effect, the DLC film can expect an effect to suppress the thermal deterioration of the EL element. In this embodiment, it is also effective to use the DLC film in a form that a silicon nitride film or a silicon carbide film is laminated to the DLC film.

Further, the DLC film may be doped with fluorine or hydrogen. Further, by setting the oxygen concentration in the DLC film to not more than $1\times10^{18}$ atoms/cm$^3$, it becomes possible to reduce the permeability of the oxygen.

Finally, numeral 812 indicates an unload chamber and this chamber is provided with an exhaust system 8001. The substrate on which the EL element is formed is taken out from this chamber.

As mentioned above, with the use of the film forming device shown in FIG. 20, it becomes possible to prevent the EL element from being exposed to the outside air until the EL element is completely sealed in the hermetically sealed space and hence, the EL display device having high reliability can be fabricated. Further, the EL display device can be fabricated with high throughput by an in-line system.

Further, it is effective to operate respective processing chambers, the exhaust systems and the transport system of the film forming device described in this embodiment under a computer control. In this embodiment, since the EL element is completed by continuously performing a series of processing, it becomes possible to perform the computer control from the supply of the substrate to the take-out of the substrate.

The EL display device having any one of the constitutions described in the embodiments 1 to 10 may be fabricated with the use of the film forming device described in this embodiment.

Embodiment 12

In the invention, an external light emitting quantum efficiency can be remarkably improved by using an EL material by which phosphorescence from a triplet exciton can be employed for emitting light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

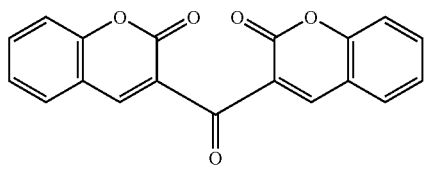

(M. A. Baldo, D. F. O' Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical formula 2)

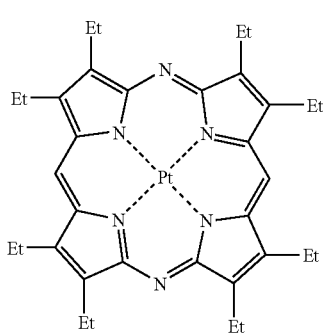

(M. A. Baldo, S. Lamansky, P. E. Burrows, M. E. Thompson, S. R. Forrest, Appl. Phys. Lett., 75 (1999) p.4.) (T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502.)

The molecular formula of an EL material (Ir complex) reported by the above article is represented as follows.

(Chemical formula 3)

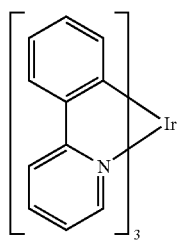

As described above, if phosphorescence from a triplet exciton can be put to practical use, it can realize the external light emitting quantum efficiency three to four times as high as that in the case of using fluorescence from a singlet exciton in principle. Note that the constitution of this embodiment can be freely implemented in combination of any structures of the embodiments 1 to 11.

Embodiment 13

In this embodiment, a specific example of the EL element 383 of the embodiment 1 shown in FIG. 4(B) is explained in conjunction with FIG. 17. The structural example of the EL element described in this embodiment corresponds to an example which enlarges a portion of the EL element 383 shown in FIG. 4(B). In this embodiment, as material which constitutes the EL layer, known organic material or inorganic material can be used. Further, either high-molecular material or the low-molecular material can be used.

Figure 17A:
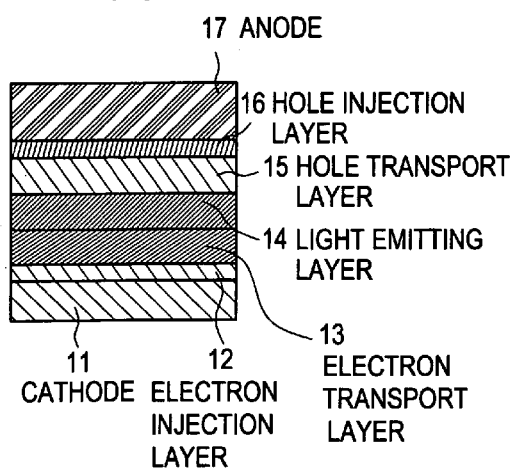
FIGS. 17(A) to 17(F)) are views showing a structure of an EL element.

First of all, FIG. 17(A) shows an EL element having a structure formed by laminating an electron injection layer 12, an electron transport layer 13, a light emitting layer 14, a hole transport layer 15, a hole injection layer 16 and an anode 17 on a cathode (pixel electrode) 11. Here, the light emitting layer 14 may be formed of three kinds of light emitting layers in a film form which respectively correspond to red, green and blue.

In this embodiment, the preprocessing of the cathode 11 is performed in the preprocessing chamber 802, the electron injection layer 12 is formed in the vapor deposition chamber (A) 803, the electron transport layer 13 is formed in the vapor deposition chamber (B) 804, the light emitting layer 14 is formed in the vapor deposition chamber (C) 805 to the vapor deposition chamber (E) 807, the hole transport layer 15 is formed in the vapor deposition chamber (F) 808, the hole injection layer 16 is formed in the vapor deposition chamber (G) 809, and the anode 17 is formed in the vapor deposition chamber (H) 810.

Figure 17B:
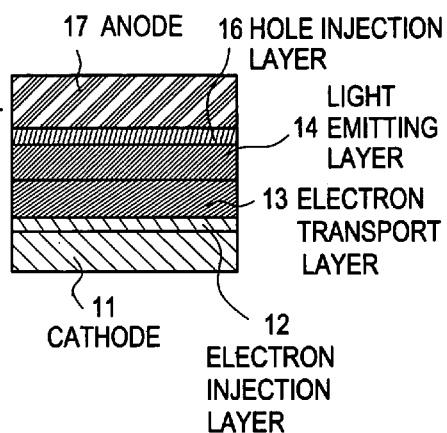

Then, FIG. 17(B) shows an EL element having a structure formed by laminating an electron injection layer 12, an electron transport layer 13, a light emitting layer 14, a hole injection layer 16 and an anode 17 on a cathode (pixel electrode) 11. Here, the light emitting layer 14 may be formed of three kinds of light emitting layers in a film form which respectively correspond to red, green and blue.

In this embodiment, the preprocessing of the cathode 11 is performed in the preprocessing chamber 802, the electron injection layer 12 is formed in the vapor deposition chamber (A) 803, the electron transport layer 13 is formed in the vapor deposition chamber (B) 804, and the light emitting layer 14 is formed in the vapor deposition chamber (C) 805 to the vapor deposition chamber (E) 807. Then, after passing the vapor deposition chamber (F) 808, the hole injection layer 16 is formed in the vapor deposition chamber (G) 809, and the anode 17 is formed in the vapor deposition chamber (H) 810.

Figure 17C:
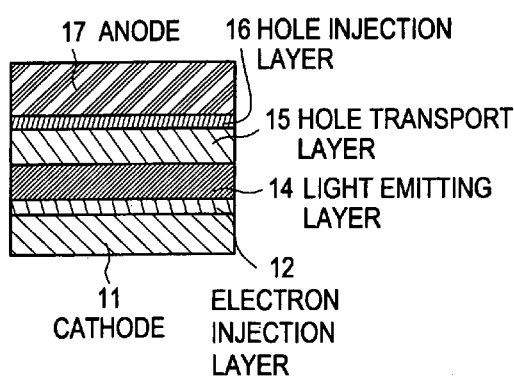

Then, FIG. 17(C) shows an EL element having a structure formed by laminating an electron injection layer 12, a light emitting layer 14, a hole transport layer 15, a hole injection layer 16 and an anode 17 on a cathode (pixel electrode) 11. Here, the light emitting layer 14 may be formed of three kinds of light emitting layers in a film form which respectively correspond to red, green and blue.

In this embodiment, the preprocessing of the cathode 11 is performed in the preprocessing chamber 802 and the electron injection layer 12 is formed in the vapor deposition chamber (A) 803. Then, after passing the vapor deposition chamber (B) 804, the light emitting layer 14 is formed in the vapor deposition chamber (C) 805 to the vapor deposition chamber (E) 807, the hole transport layer 15 is formed in the vapor deposition chamber (F) 808, the hole injection layer 16 is formed in the vapor deposition chamber (G) 809, and the anode 17 is formed in the vapor deposition chamber (H) 810.

Figure 17D:
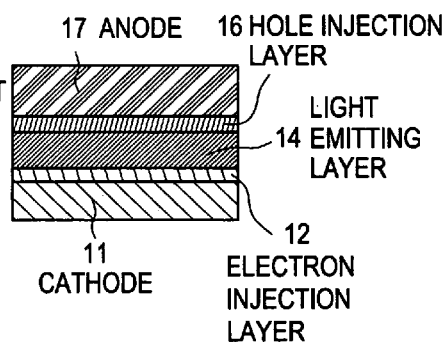

Then, FIG. 17(D) shows an EL element having a structure formed by laminating an electron injection layer 12, a light emitting layer 14, a hole injection layer 16 and an anode 17 on a cathode (pixel electrode) 11. Here, the light emitting layer 14 may be formed of three kinds of light emitting layers in a film form which respectively correspond to red, green and blue.

In this embodiment, the preprocessing of the cathode 11 is performed in the preprocessing chamber 802 and the electron injection layer 12 is formed in the vapor deposition chamber (A) 803. Then, after passing the vapor deposition chamber (B) 804, the light emitting layer 14 is formed in the vapor deposition chamber (C) 805 to the vapor deposition chamber (E) 807. Then, after passing the vapor deposition chamber (F) 808, the hole injection layer 16 is formed in the vapor deposition chamber (G) 809, and the anode 17 is formed in the vapor deposition chamber (H) 810.

Figure 17E:
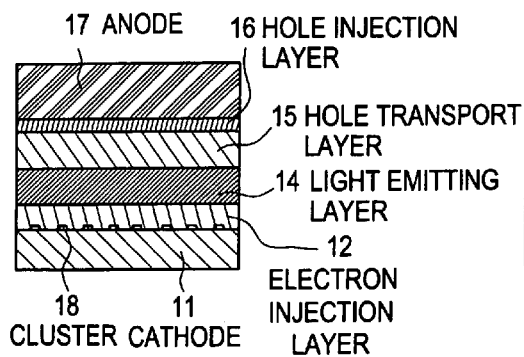

Then, FIG. 17(E) shows an EL element having a structure formed by laminating clusters 18, an electron transport layer 13, a light emitting layer 14, a hole transport layer 15, a hole injection layer 16 and an anode 17 on a cathode (pixel electrode) 11. Here, the light emitting layer 14 may be formed of three kinds of light emitting layers in a film form which respectively correspond to red, green and blue. Further, the clusters 18 are provided for lowering the work function of the cathode 11 and are formed by providing an element belonging to a group 1 or a group 2 of the periodic table in a cluster shape in this embodiment.

In this embodiment, the preprocessing of the cathode 11 is performed in the preprocessing chamber 802, the clusters 18 are formed in the vapor deposition chamber (A) 803, the electron transport layer 13 is formed in the vapor deposition chamber (B) 804, the light emitting layer 14 is formed in the vapor deposition chamber (C) 805 to the vapor deposition chamber (E) 807, the hole transport layer 15 is formed in the vapor deposition chamber (F) 808, the hole injection layer 16 is formed in the vapor deposition chamber (G) 809, and the anode 17 is formed in the vapor deposition chamber (H) 810.

Figure 17F:
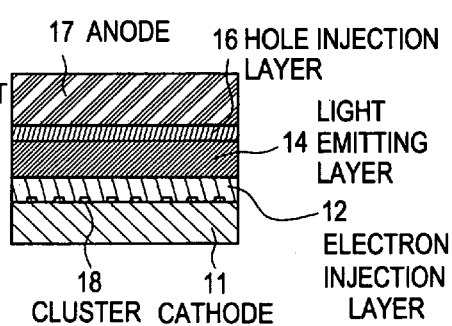

Then, FIG. 17(F) shows an EL element having a structure formed by laminating clusters 18, an electron transport layer 13, a light emitting layer 14, a hole injection layer 16 and an anode 17 on a cathode (pixel electrode) 11. Here, the light emitting layer 14 may be formed of three kinds of light emitting layers in a film form which respectively correspond to red, green and blue.

In this embodiment, the preprocessing of the cathode 11 is performed in the preprocessing chamber 802, the clusters 18 are formed in the vapor deposition chamber (A) 803, the electron transport layer 13 is formed in the vapor deposition chamber (B) 804 and the light emitting layer 14 is formed in the vapor deposition chamber (C) 805 to the vapor deposition chamber (E) 807. Then, after passing the vapor deposition chamber (F) 808, the hole injection layer 16 is formed in the vapor deposition chamber (G) 809 and the anode 17 is formed in the vapor deposition chamber (H) 810.

As described above, even when the EL elements having various structures are formed, they can be easily fabricated using the film forming device shown in FIG. 16. The constitutions shown in this embodiment can be carried out in combination with any one of constitutions described in the embodiment 1 to the embodiment 12.

Embodiment 14

A light emitting device formed by implementing the present invention has superior visibility in bright locations in comparison to a liquid crystal display device because it is a self-emissive type device, and moreover its field of vision is wide. Accordingly, it can be used as a display portion for various electric appliances. At the time, although the light emitting device of the present invention is a passive type light emitting device, large screen can be realized by reducing the wiring resistance, thereby the light emitting device has many uses.

The following can be given as examples of such electric appliances of the present invention: a video camera; a digital camera; a goggle type display (head mounted display); a car navigation system; a car audio system; a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a compact disk (CD), a laser disk, or a digital versatile disk (DVD). Examples of these electric appliances are shown in FIGS. 18 and 19.

Figure 18A:
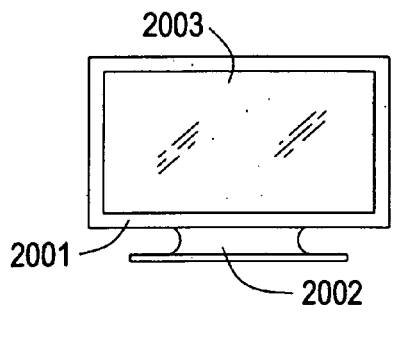
FIGS. 18(A) to 18(F) are views showing specific examples of electric appliances.

FIG. 18A shows an EL display, containing a casing 2001, a support stand 2002, and a display portion 2003. The light emitting device of the present invention can be used in the display portion 2003. Since the EL display is a self-emissive type device with no need of a backlight, its display portion can be made thinner than a liquid crystal display device.

Figure 18B:
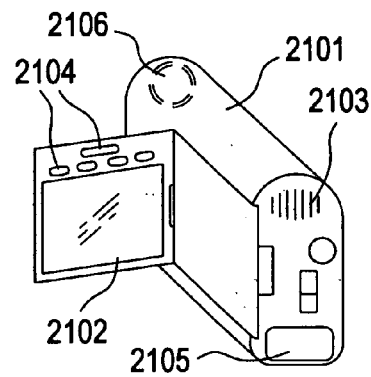

FIG. 18B shows a video camera, containing a main body 2101, a display portion 2102, an audio input portion 2103, operation switches 2104, a battery 2105, and an image receiving portion 2106. The light emitting device of the present invention can be used in the display portion 2102.

Figure 18C:
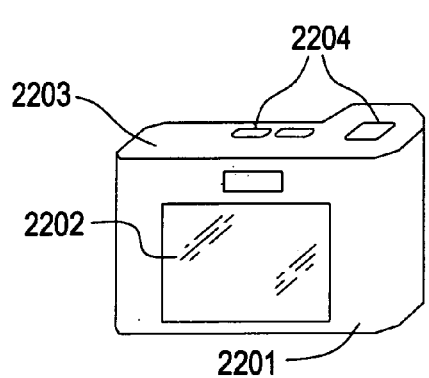

FIG. 18C shows a digital camera, containing a main body 2201, a display portion 2202, a view finder portion 2203, and operation switches 2204. The light emitting device of the present invention can be used in the display portion 2202.

Figure 18D:
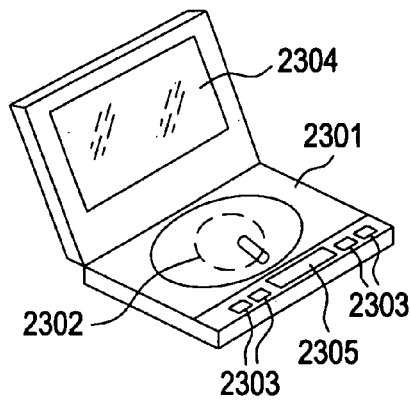

FIG. 18D shows an image playback device (specifically, a DVD playback device) provided with a recording medium, containing a main body 2301, a recording medium (such as CD, LD and DVD) 2302, operation switches 2303, a display portion (a) 2304, and a display portion (b) 2305. The display portion (a) 2304 is mainly used for displaying image information, and the display portion (b) 2305 is mainly used for displaying character information, and the light emitting device of the present invention can be used in the display portions (a) and (b). Note that a CD reproducing device, a game equipment, or the like is included as the image reproducing device provided with a recording medium.

Figure 18E:
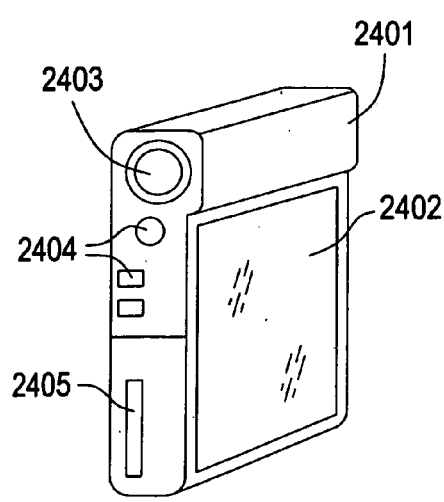

FIG. 18E shows a portable (mobile) computer, containing a main body 2401, a display portion 2402, an image receiving portion 2403, operation switches 2404, and a memory slot 2405. The electro optical device of the present invention can be used as the display portion 2402. This portable computer can record or play back information in the recording medium which is an accumulation of flash memory or nonvolatile memory.

Figure 18F:
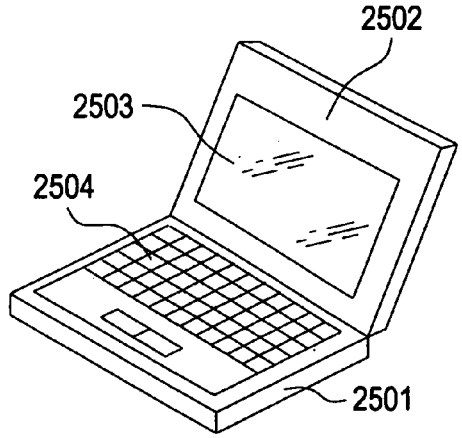

FIG. 18F shows a personal computer, containing a main body 2501, a casing 2502, a display portion 2503, and a keyboard 2504. The light emitting device of the present invention can be used as the display portion 2503.

Note that if the luminance of an EL material increases in the future, then it will become possible to use the light emitting device of the present invention in a front type or a rear type projector by expanding and projecting light containing output image information with a lens or the like.

Further, the above electronic devices display often information transmitted through an electronic communication circuit such as the Internet and CATV (cable TV), and particularly situations of displaying moving images is increasing. Since the response speed of EL materials is very high, the light emitting device is suitable for performing animation display.

In addition, since the light emitting device consumes power in the light emitting portion, it is preferable to display information so as to make the light emitting portion as small as possible. Consequently, when using the light emitting device in a display portion mainly for character information, such as in a portable information terminal, in particular a portable telephone or a car audio stereo, it is preferable to drive the light emitting device so as to form character information by the light emitting portions while non-light emitting portions are set as background.

Figure 19A:
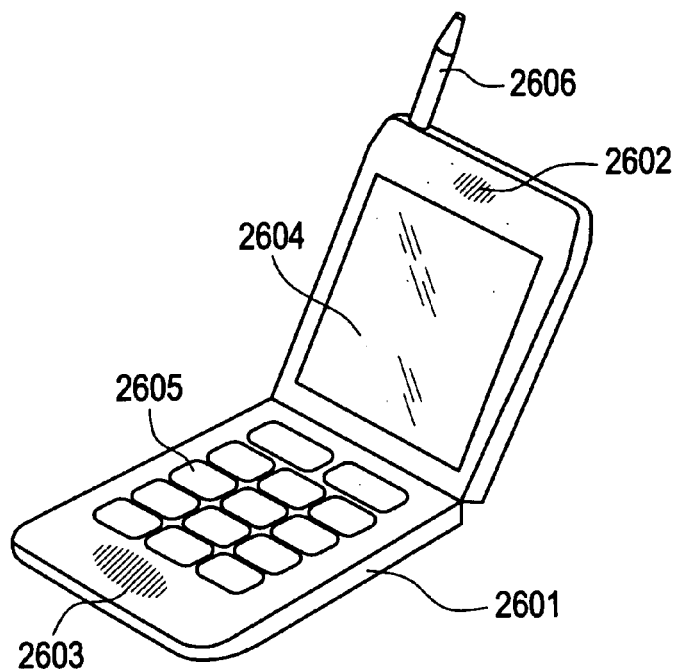
FIGS. 19(A) and 19(B) are views showing specific examples of electric appliances.

FIG. 19A shows a portable telephone, containing a main body 2601, a sound output portion 2602, a sound input portion 2603, a display portion 2604, operation switches 2605, and an antenna 2606. The light emitting device of the present invention can be used as the display portion 2604. Note that the display portion 2604 can suppress the power consumption of the portable telephone by displaying white color characters in a black color background.

Figure 19B:
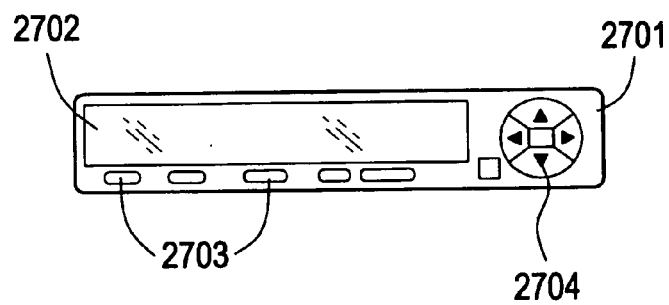

FIG. 19B shows a car audio stereo, containing a main body 2701, a display portion 2702, and operation switches 2703 and 2704. The light emitting device of the present invention can be used as the display portion 2702. Further, a car mounting audio stereo is shown in this embodiment, but a fixed type audio playback device may also be used. Note that, by displaying white color characters in a black color background, the display portion 2704 can suppress the power consumption.

As described above, the application range of this invention is extremely wide, and it may be used for electric appliances in various fields. Further, the electric appliances of this embodiment may be obtained by using a light emitting device freely combining the structures of the embodiments 1 to 13.

As has been described heretofore, by carrying out the present invention, the TFT can be fabricated with the fabrication steps which includes the least photolithography steps so that the yield of active-matrix type light emitting devices using TFTs can be enhanced. Further, the fabrication period of the light emitting devices can be shortened and it becomes possible to provide inexpensive light emitting devices by reducing the fabrication cost. Still further, it becomes possible to provide inexpensive electric appliances using such inexpensive light emitting devices.

What is claimed is:

1. A semiconductor device comprising,
a pixel with an n-channel type TFT, a light emitting element and a coloring layer,
wherein the n-channel type TFT comprises:
an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and
a gate electrode which includes a first conductive film and a second conductive film having a contour smaller than a contour of the first conductive film,
wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

2. The semiconductor device according to claim 1, wherein the first conductive film is made of tantalum nitride, and the second conductive film is made of tungsten.

3. The semiconductor device according to claim 1, wherein the n-type impurity region (a) contains an n-type impurity element at the concentration of $1\times10^{20}$–$1\times10^{21}$ atoms/cm$^3$, the n-type impurity region (b) contains an n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

4. The semiconductor device according to claim 1, wherein the gate electrode is covered with an insulation film which is laminated with a silicon oxide nitride film and a resin film.

5. The semiconductor device according to claim 1, wherein the gate electrode is covered with an insulation film which is laminated with a silicon nitride film and a resin film.

6. The semiconductor device according to claim 1, wherein an outermost surface of a wiring which is connected to the n-channel type TFT is made of a metal film including an element selected from a group 1 or a group 2 of the periodic table or a bismuth film.

7. A semiconductor device comprising,
a pixel with an n-channel type TFT, a light emitting element electrically connected to the n-channel type TFT and a coloring layer,
wherein the n-channel type TFT comprises:
an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and
a gate electrode which includes a first conductive film and a second conductive film having a contour smaller than a contour of the first conductive film,
wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

8. The semiconductor device according to claim 7, wherein the first conductive film is made of tantalum nitride, and the second conductive film is made of tungsten.

9. The semiconductor device according to claim 7, wherein the n-type impurity region (a) contains an n-type impurity element at the concentration of $1\times10^{20}$–$1\times10^{21}$ atoms/cm$^3$, the n-type impurity region (b) contains an n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

10. The semiconductor device according to claim 7, wherein the gate electrode is covered with an insulation film which is laminated with a silicon oxide nitride film and a resin film.

11. The semiconductor device according to claim 7, wherein the gate electrode is covered with an insulation film which is laminated with a silicon nitride film and a resin film.

12. The semiconductor device according to claim 7, wherein an outermost surface of a wiring which is connected to the n-channel type TFT is made of a metal film including an element selected from a group 1 or a group 2 of the periodic table or a bismuth film.

13. A semiconductor device comprising,
a pixel with an n-channel type TFT, a light emitting element, passivation film covering the light emitting element, and a coloring layer,
wherein the n-channel type TFT comprises:
an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and
a gate electrode which includes a first conductive film and a second conductive film having a contour smaller than a contour of the first conductive film,
wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

14. The semiconductor device according to claim 13, wherein the first conductive film is made of tantalum nitride, and the second conductive film is made of tungsten.

15. The semiconductor device according to claim 13, wherein the n-type impurity region (a) contains an n-type impurity element at the concentration of $1\times10^{20}$–$1\times10^{21}$ atoms/cm$^3$, the n-type impurity region (b) contains an n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

16. The semiconductor device according to claim 13, wherein the gate electrode is covered with an insulation film which is laminated with a silicon oxide nitride film and a resin film.

17. The semiconductor device according to claim 13, wherein the gate electrode is covered with an insulation film which is laminated with a silicon nitride film and a resin film.

18. The semiconductor device according to claim 13, wherein an outermost surface of a wiring which is connected to the n-channel type TFT is made of a metal film including an element selected from a group 1 or a group 2 of the periodic table or a bismuth film.

19. The semiconductor device according to claim 13, wherein the passivation film is made of an insulation film selected from a group including a carbon film, a silicon nitride film and a silicon nitride-oxide film.

20. A semiconductor device comprising,
a pixel with an n-channel type TFT, a light emitting element electrically connected to the n-channel type TFT, passivation film covering the light emitting element, and a coloring layer,
wherein the n-channel type TFT comprises:
an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and
a gate electrode which includes a first conductive film and a second conductive film having a contour smaller than a contour of the first conductive film,
wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

21. The semiconductor device according to claim 20, wherein the first conductive film is made of tantalum nitride, and the second conductive film is made of tungsten.

22. The semiconductor device according to claim 20, wherein the n-type impurity region (a) contains an n-type impurity element at the concentration of $1\times10^{20}$–$1\times10^{21}$ atoms/cm$^3$, n-type impurity region (b) contains n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

23. The semiconductor device according to claim 20, wherein the gate electrode is covered with an insulation film which is laminated with a silicon oxide nitride film and a resin film.

24. The semiconductor device according to claim 20, wherein the gate electrode is covered with an insulation film which is laminated with a silicon nitride film and a resin film.

25. The semiconductor device according to claim 20, wherein an outermost surface of a wiring which is connected to the n-channel type TFT is made of a metal film including an element selected from a group 1 or a group 2 of the periodic table or a bismuth film.

26. The semiconductor device according to claim 20, wherein the passivation film is made of an insulation film selected from a group including a carbon film, a silicon nitride film and a silicon nitride-oxide film.

27. A semiconductor device comprising,
a pixel with an n-channel type TFT, a light emitting element and a coloring layer over the n-channel type TFT,
wherein the n-channel type TFT comprises:
an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and
a gate electrode which includes a first conductive film and a second conductive film having a contour smaller than a contour of the first conductive film,
wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

28. The semiconductor device according to claim 27, wherein the first conductive film is made of tantalum nitride, and the second conductive film is made of tungsten.

29. The semiconductor device according to claim 27, wherein the n-type impurity region (a) contains an n-type impurity element at the concentration of $1\times10^{20}$–$1\times10^{21}$ atoms/cm$^3$, the n-type impurity region (b) contains an n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

30. The semiconductor device according to claim 27, wherein the gate electrode is covered with an insulation film which is laminated with a silicon oxide nitride film and a resin film.

31. The semiconductor device according to claim 27, wherein the gate electrode is covered with an insulation film which is laminated with a silicon nitride film and a resin film.

32. The semiconductor device according to claim 27, wherein an outermost surface of a wiring which is connected to the n-channel type TFT is made of a metal film including an element selected from a group 1 or a group 2 of the periodic table or a bismuth film.

33. A semiconductor device comprising,
a pixel with an n-channel type TFT, a light emitting element electrically connected to the n-channel type TFT and a coloring layer over the n-channel type TFT,
wherein the n-channel type TFT comprises:

an active layer which includes a channel forming region, an n-type impurity region (c) being in contact with the channel forming region, an n-type impurity region (b) being in contact with the n-type impurity region (c) and an n-type impurity region (a) being in contact with the n-type impurity region (b); and a gate electrode which includes a first conductive film and a second conductive film having a contour smaller than a contour of the first conductive film, wherein the first conductive film is superposed over the channel forming region and the n-type impurity region (c) while sandwiching a gate insulation film therebetween, and the second conductive film is superposed over the channel forming region while sandwiching the gate insulation film and the first conductive film therebetween.

34. The semiconductor device according to claim 33, wherein the first conductive film is made of tantalum nitride, and the second conductive film is made of tungsten.

35. The semiconductor device according to claim 33, wherein the n-type impurity region (a) contains an n-type impurity element at the concentration of $1\times10^{20}$–$1\times10^{21}$ atoms/cm$^3$, the n-type impurity region (b) contains an n-type impurity element at the concentration of $2\times10^{16}$–$5\times10^{19}$ atoms/cm$^3$, and the n-type impurity region (c) contains an n-type impurity element at the concentration of $1\times10^{16}$–$5\times10^{18}$ atoms/cm$^3$.

36. The semiconductor device according to claim 33, wherein the gate electrode is covered with an insulation film which is laminated with a silicon oxide nitride film and a resin film.

37. The semiconductor device according to claim 33, wherein the gate electrode is covered with an insulation film which is laminated with a silicon nitride film and a resin film.

38. The semiconductor device according to claim 33, wherein an outermost surface of a wiring which is connected to the n-channel type TFT is made of a metal film including an element selected from a group 1 or a group 2 of the periodic table or a bismuth film.

* * * * *